United States Patent
Stamm et al.

(10) Patent No.: US 6,714,577 B1
(45) Date of Patent: Mar. 30, 2004

(54) ENERGY STABILIZED GAS DISCHARGE LASER

(75) Inventors: Uwe Stamm, Göttingen (DE); Igor Bragin, Göttingen (DE); Wolfgang Zschocke, Noerten-Hardenberg (DE)

(73) Assignee: Lambda Physik AG, Goettingen (DE)

(*) Notice: Subject to any disclaimer, the term of this patent is extended or adjusted under 35 U.S.C. 154(b) by 0 days.

(21) Appl. No.: 09/513,025

(22) Filed: Feb. 25, 2000

Related U.S. Application Data

(63) Continuation-in-part of application No. 09/498,121, filed on Feb. 4, 2000, which is a continuation-in-part of application No. 09/484,818, filed on Jan. 18, 2000.

(60) Provisional application No. 60/160,126, filed on Oct. 18, 1999, provisional application No. 60/127,062, filed on Mar. 31, 1999, provisional application No. 60/178,620, filed on Jan. 27, 2000, and provisional application No. 60/124,785, filed on Mar. 17, 1999.

(51) Int. Cl.[7] ............................................. H01S 3/22

(52) U.S. Cl. ................................................ 372/60; 372/57

(58) Field of Search ............................... 372/60, 57

(56) References Cited

U.S. PATENT DOCUMENTS

| | | | |
|---|---|---|---|
| 4,009,933 A | 3/1977 | Firester | 350/152 |
| 4,240,044 A | 12/1980 | Fahlen et al. | 331/94 |

(List continued on next page.)

FOREIGN PATENT DOCUMENTS

| | | | | |
|---|---|---|---|---|
| DE | 32 12928 A1 | 10/1983 | ............. | H01S/3/02 |
| DE | 295 202 00 | 12/1995 | | |
| DE | 196 18 119 A1 | 11/1996 | ............. | H01S/3/134 |
| DE | 297 13 755 U1 | 11/1997 | ............. | H01S/3/03 |
| EP | 0 459 503 A3 | 12/1991 | ............. | H01S/3/08 |
| EP | 0 459 503 A2 | 12/1991 | ............. | H01S/3/08 |
| EP | 0 532 751 A1 | 3/1993 | ............. | H01S/3/038 |
| EP | 0 532 751 B1 | 5/1995 | ............. | H01S/3/038 |
| EP | 1 075 060 A2 | 2/2001 | ............. | H01S/3/225 |
| EP | 1 091 462 A2 | 4/2001 | ............. | H01S/3/225 |
| JP | 6-25008 | of 1994 | ............. | G02B/5/18 |
| JP | 8-8481 | 6/1994 | ............. | H01S/3/134 |
| JP | 10341050 | 12/1998 | ............. | H01S/3/036 |
| WO | WO 99/19952 | 4/1999 | ............. | H01S/3/22 |
| WO | PCT/IB 00/ 01627 | 10/2000 | | |

OTHER PUBLICATIONS

Performance Improvement Kataoka et al; of A Dixcharged pumped ArF Excimer Lasetrby Xenon Gas Addition.*
O. Semprez, "Enabling DUV Lithography–A light source manufacture's point of view", *The Source*, vol. 1, Issue 2, pp. 3–7, Summer 1999.

(List continued on next page.)

*Primary Examiner*—Leon Scott, Jr.
(74) *Attorney, Agent, or Firm*—Sierra Patent Group, Ltd.; Andrew V. Smith

(57) ABSTRACT

An excimer or molecular fluorine laser, such as a KrF- or ArF-laser, or a molecular fluorine ($F_2$) laser, particularly for photolithography applications, has a gas mixture including a trace amount of a gas additive. The concentration of the gas additive in the gas mixture is optimized for improving energy stability and/or the overshoot control of the laser output beam. The concentration is further determined and adjusted at new fills and/or during laser operation based on its effect on the output pulse energy in view of constraints and/or aging on the discharge circuit and/or other components of the laser system. Attenuation control is also provided for increasing the lifetimes of components of the laser system by controlling the concentration of the gas additive over time. A specific preferred concentration of xenon is more than 100 ppm for improving the energy stability and/or overshoot control. The laser system may be equipped with an internal gas supply unit including an internal xenon gas supply, or a xenon generator for supplying xenon gas from condensed matter xenon.

93 Claims, 6 Drawing Sheets

U.S. PATENT DOCUMENTS

| | | | |
|---|---|---|---|
| 4,380,079 A | 4/1983 | Cohn et al. | 372/87 |
| 4,393,505 A | 7/1983 | Fahlen | 372/57 |
| 4,399,540 A | 8/1983 | Bücher | 372/20 |
| 4,429,392 A | 1/1984 | Yoshida et al. | 372/9 |
| 4,534,034 A | 8/1985 | Hohla et al. | 372/89 |
| 4,611,270 A | 9/1986 | Klauminzer et al. | 364/183 |
| 4,616,908 A | 10/1986 | King | 350/576 |
| 4,674,099 A | 6/1987 | Turner | 372/59 |
| 4,686,682 A | 8/1987 | Haruta et al. | 372/87 |
| 4,691,322 A | 9/1987 | Nozue et al. | 372/82 |
| 4,716,569 A | 12/1987 | Bees | 372/81 |
| 4,719,637 A | 1/1988 | Cavaioli et al. | 372/59 |
| 4,722,090 A | 1/1988 | Haruta et al. | 372/57 |
| 4,740,982 A | 4/1988 | Hakuta et al. | 372/59 |
| 4,763,336 A | 8/1988 | Stephens | 372/81 |
| 4,829,536 A | 5/1989 | Kajiyama et al. | 372/57 |
| 4,856,018 A | 8/1989 | Nozue et al. | 372/99 |
| 4,891,818 A | 1/1990 | Levatter | 372/57 |
| 4,905,243 A | 2/1990 | Lokai et al. | 372/32 |
| 4,926,428 A | 5/1990 | Kajiyama et al. | 372/20 |
| 4,975,919 A | 12/1990 | Amada et al. | 372/83 |
| 4,977,573 A | 12/1990 | Bittenson et al. | 372/81 |
| 5,001,721 A | 3/1991 | Ludewig et al. | 372/59 |
| 5,025,445 A | 6/1991 | Anderson et al. | 372/20 |
| 5,081,635 A | 1/1992 | Wakabayashi et al. | 372/57 |
| 5,090,020 A | 2/1992 | Bedwell | 372/59 |
| 5,095,492 A | 3/1992 | Sandstrom | 372/102 |
| 5,097,291 A | 3/1992 | Suzuki | 355/69 |
| 5,111,473 A | 5/1992 | Rebhan et al. | 372/59 |
| 5,136,605 A | 8/1992 | Basting et al. | 372/59 |
| 5,142,543 A | 8/1992 | Wakabayashi et al. | 372/32 |
| 5,149,659 A | 9/1992 | Hakuta et al. | 436/55 |
| 5,150,370 A | 9/1992 | Furuya et al. | 372/106 |
| 5,168,400 A | 12/1992 | Moses | 359/333 |
| 5,247,531 A | 9/1993 | Müller-Horshe | 372/38 |
| 5,247,535 A | 9/1993 | Muller-Horsche et al. | 372/86 |
| 5,260,961 A | 11/1993 | Zhou et al. | 372/57 |
| 5,307,364 A | 4/1994 | Turner | 372/60 |
| 5,337,330 A | 8/1994 | Larson | 372/86 |
| 5,377,215 A | 12/1994 | Das et al. | 372/57 |
| 5,396,514 A | 3/1995 | Voss | 372/57 |
| 5,430,752 A | 7/1995 | Basting et al. | 372/59 |
| 5,440,578 A | 8/1995 | Sandstrom | 372/59 |
| 5,450,436 A | 9/1995 | Mizoguchi et al. | 372/59 |
| 5,463,650 A | 10/1995 | Ito et al. | 372/57 |
| 5,534,034 A | 7/1996 | Caspers | 623/32 |
| 5,535,233 A | 7/1996 | Mizoguchi et al. | 372/87 |
| 5,557,629 A | 9/1996 | Mizoguchi et al. | 372/87 |
| 5,586,134 A | 12/1996 | Das et al. | 372/38 |
| 5,598,300 A | 1/1997 | Magnusson et al. | 359/566 |
| 5,642,374 A | 6/1997 | Wakabayashi et al. | 372/57 |
| 5,646,954 A | 7/1997 | Das et al. | 372/55 |
| 5,652,681 A | 7/1997 | Chen et al. | 359/831 |
| 5,659,531 A | 8/1997 | Ono et al. | 369/109 |
| 5,668,067 A | 9/1997 | Araujo et al. | 501/54 |
| 5,708,495 A | 1/1998 | Pitz et al. | 356/28 |
| 5,710,787 A | 1/1998 | Amada et al. | 372/25 |
| 5,754,579 A | 5/1998 | Mizoguchi et al. | 372/58 |
| 5,761,236 A | 6/1998 | Kleinschmidt et al. | 372/100 |
| 5,771,258 A | 6/1998 | Morton et al. | 372/57 |
| 5,835,520 A | 11/1998 | Das et al. | 372/57 |
| 5,887,014 A | 3/1999 | Das | 372/59 |
| 5,923,693 A | 7/1999 | Ohmi et al. | 372/57 |
| 5,978,405 A | 11/1999 | Juhasz et al. | 372/57 |
| 5,978,406 A | 11/1999 | Rokni et al. | 372/58 |
| 5,982,800 A | 11/1999 | Ishihara et al. | 372/57 |
| 6,005,879 A | 12/1999 | Sandstrom et al. | 372/25 |
| 6,014,398 A | 1/2000 | Hofmann et al. | 372/60 |
| 6,018,537 A | 1/2000 | Hofmann et al. | 372/25 |
| 6,130,904 A | 10/2000 | Ishihara et al. | 372/59 |
| 6,151,350 A | 11/2000 | Komori et al. | 372/59 |
| 6,188,710 B1 * | 2/2001 | Besaucele et al. | 372/60 |

OTHER PUBLICATIONS

O. Wakabayashi et al., "Billion level durable ArF excimer laser with highly stable energy," Laser Research Dept., Komatsu Ltd., Japan, 11 pages.

R.S. Taylor et al., "Transmission Properties of Spark Preionization Radiation in Rare–Gas Halide Laser Gas Mixes," *IEEE Journal of Quantum Electronics*, vol. 31, No. 12, pp. 2195–2207, Dec. 1995.

Weisskoft, et al., "Berechnung der natürlichen Linienbreite auf Grund der Diracschen Lichttheorie," *Zeitschrift für Physik*, 1930, pp. 54–73.

Eberly, J., "Superradiance Revisited," *American Journal of Physics*, Oct. 1972, vol. 40, No. 10, pp. 1374–1383.

Chang, T.Y., "Improved Uniform–Field Electrode Profiles for TEA Laser and High–Voltage Applications," *The Review of Scientific Instruments*, Apr. 1973, vol. 44, No. 4, pp. 405–407.

Taylor et al., "Transmission Property of Spark Preionization Radiation in Rare–Gas Halide Laser Gas Mixes," *IEEE Journal of Quantum Electronics*, vol. 31, No. 12, Dec. 1995, pp. 2195–2207.

Kataoka et al., "Performance Improvement of a Discharge–Pumped ArF Excimer Laser by Xenon," *Japanese Journal of Applied Physics*, vol. 38, Part 1, No. 12A, Dec. 1999, pp. 6735–6738.

E.A. Stappaerts, "A Novel Analytical Design Method for Discharge Laser Electrode Profiles," *Applied Physics Letters*, Jun. 15, 1982, vol. 40, No. 12, pp. 1018–1019.

Ernst G.J., "Compact Uniform Field Electrode Profiles," *Optics Communications*, Aug. 1, 1983, vol. 47, No. 1, pp. 47–51.

Ernst, G.J., "Uniform–Field Electrodes with Minimum Width," *Optics Communications*, Mar. 15, 1984, vol. 49, No. 4, pp. 275–277.

Marchetti et al., "A New Type of Corona–Discharge Photoionization Source for Gas Lasers," *Journal of Applied Physics*, Dec. 1, 1984; vol. 56., No. 11., pp. 3163–3168.

Taylor, R.S., "Preionization and Discharge Stability Study of Long Optical Pulse Duration UV–Preionized XeC1 Lasers", *Applied Physics B*, 1986, vol. 41., pp. 1–24.

Jursich et al., "Gas Contaminant Effects in Discharge–excited KrF Lasers," *Applied Physics*, Apr. 20, 1992, vol. 31, No. 12, pp. 1975–1981.

Lambda Physik Highlights, Apr. 1993.

Borisov, et al., "Effects Limiting the Average Power of Compact Pulse–periodic KrF Lasers," *Quantum Electronics*, May 1995, vol. 25, No. 5, pp. 421–425.

Patzel, et al., "KrF Excimer Laser with Repetition Rates of 1 kHz for DUV Lithography," *Proceedings of SPIE—The International Society for Optical Engineering, Optical/Laser Microlithography VIII*, Feb. 22–24, 1995, vol. 2440, pp. 101–105.

Taylor et al., "Transmission Property of Spark Preionization Radiation in Rare–Gas Halide Laser Gas Mixes," *IEEE Journal of Quantum Electronics*, vol. 31, No. 12, Dec. 1995, pp. 2195–2207.

Kataoka et al., "Performance Improvement of a Discharge–Pumped ArF Excimer Laser by Xenon," *Japanese Journal of Applied Physics*, vol. 38, Part 1, No. 12A, Dec. 1999, pp. 6735–6738.

Kataota, et al., "Performance Improvement of a Discharge–Pumped ArF Excimer Laser by Xenon Gas Addition," *Jpn. J.Appl.Phys.*, vol. 38, 1999, pp. 6735–6738.

Patent Abstracts of Japan, vol. 016, No. 312, Jul. 9, 1992 & JP 04 087388 A.

* cited by examiner

ENERGY STABILIZED GAS DISCHARGE LASER

PRIORITY

The present application is a Continuation-in-part application that claims the benefit of priority to U.S. patent application Ser. No. 09/498,121, filed Feb. 4, 2000, and Ser. No. 09/484,818, filed Jan. 18, 2000, and also claims the benefit of priority to provisional patent applications No. 60/160, 126, filed Oct. 18, 1999, and No. 60/127,062, filed Mar. 31, 1999, No. 60/124,785 filed Mar. 17, 1999 and No. 60/178, 620, filed Jan. 27, 2000, each application being hereby incorporated by reference into the present application.

BACKGROUND OF THE INVENTION

1. Field of the Invention

The invention relates to gas discharge lasers, particularly to excimer and molecular fluorine lasers having gas mixtures with optimal concentrations of specific component gases, such as halogen containing species, active rare gases, buffer gases, and a xenon additive for improving pulse-to-pulse and peak-to-peak energy stabilities, energy dose stability and burst energy overshoot control, and increasing the lifetimes of laser system components.

2. Discussion of the Related Art

The term "excimer laser" describes gas lasers in which the lasing medium contains excimers (e.g. $Ar_2^*$), exciplexes (e.g. $ArF^*$) or trimers (e.g. $Kr_2F^*$). The feature common to all is a gas discharge in which highly excited molecules that have no stable ground state are created. The following invention primarily concerns excimer lasers in which the lasing medium is composed of halogen-containing, particularly fluorine-containing exciplexes (e.g. $ArF^*$ and $KrF^*$). In addition, the present invention relates to molecular fluorine ($F_2$) lasers.

In a number of scientific, medical and industrial applications for excimer and molecular gas lasers, it is important that the radiation pulses emitted have a stable (constant) energy. In gas lasers, the fact that gas discharge conditions and characteristics can change has an impact on the achievement of a constant energy from pulse to pulse of the emitted radiation. Characteristics and conditions of the gas discharge are dependent upon a number of parameters that with adequate control can allow significant improvements toward exact reproducibility. The result is that the energy of the emitted laser radiation pulses is not maintained exactly constant from pulse to pulse. It is desired to have an excimer or molecular fluorine laser that demonstrates greater pulse-to-pulse stability.

Energy stability is described by various characteristics of the laser beam depending on the application. One of these characteristics is the standard deviation sigma of a distribution of energies of a large number of laser pulses. As many applications use laser output not continuously but in bursts of light pulses, other parameters are also used for stability (see U.S. Pat. No. 5,463,650, which is hereby incorporated by reference into the present application, and particularly the background discussion therein). Specific application of the excimer or molecular fluorine laser beam in optical lithography as an illumination source for wafer scanners, the energy dose stability is significant (see U.S. Pat. No. 5,140, 600, which is assigned to the same assignee as the present application, and The Source™ (Cymer, Inc.), Vol. 1, Issue 2 (Summer 1999), each of which is hereby incorporated by reference into the present application).

Another significant characteristic is peak-to-peak stability. For measuring the peak-to-peak energy stability values, laser pulse energies are accumulated over some interval. The absolute difference between the maximum and minimum energies related to the average laser pulse energy is defined as the peak-to-peak stability.

Of particular interest in burst mode applications, the energy overshoot, as illustrated in FIG. 1, is a significant characteristic. Energy overshoot, or spiking, is observed when the laser isoperated with constant high voltage at the discharge chamber in burst mode and the first few pulses have higher energies than pulses later in the burst (see U.S. Pat. Nos. 5,710,787 and 5,463,650, hereby incorporated by reference). The energy overshoot (designated "ovs" in FIG. 1) is defined as the difference between the energy of the first pulse in a burst and the steady state energy in the entire burst.

The quality of the gas discharge and also the pulse energy of the emitted laser radiation pulses are dependent upon and are sensitive to variations in gas discharge conditions such as characteristics of the external electrical circuit, the composition and shape of the gas discharge electrodes, the type and quality of pre-ionization, etc. The purity of the gas mixture in the laser gas discharge chamber and the composition of the gas are also very important. Even tiny impurities of certain kinds are known to be very detrimental to the energy of the emitted radiation pulses, the stability of their energy (the consistency of energy per laser pulse from one firing to the next), the intensity distribution in the laser beam profile, the life of the laser gas and the life of individual optical and other laser components. Such impurities in the gas can be present in the gas mixture from the very beginning or they may form during operation of the laser, e.g. through interactions between reactive components of the laser gas mixture (e.g. of the halogen) and the laser chamber material or through diffusion from the materials or chemical reactions in the gas mixture. For example, during operation of a KrF-excimer laser, such contaminants as HF, $CF_4$, $COF_2$, $SiF_4$ have been observed to increase in concentration rapidly (see G. M. Jurisch et al., *Gas Contaminant Effects in Discharge-Excited KrF Lasers,* Applied Optics, Vol. 31, No. 12, pp. 1975–1981 (Apr. 20, 1992)). For a static KrF laser gas mixture, i.e., with no discharge running, increases in the concentrations of HF, $O_2$, $CO_2$ and $SiF_4$ have been observed (see Jurisch et al., above).

It is known that the addition of certain substances to the gas mixture can improve particular characteristics of the emitted radiation. For example, U.S. Pat. Nos. 5,307,364 and 5,982,800 (hereby incorporated by reference) suggest that small amounts of oxygen be added to the gas mixture to achieve greater reproducibility of emitted radiation during laser operation. Oxygen, however, is not an inert gas, and its effects on other parameters of the excimer laser, such as the uniformity of the emission intensity curve and the life of the gas mixture are not yet fully understood and may be in fact detrimental. Oxygen, especially atomic oxygen and ozone which can form in the gas discharge, are extremely chemically reactive, and their effects on the laser gas mixture can be quite detrimental, especially during long periods of operation. Due to the presence of oxygen, other stable impurities such as $OF_2$ and FONO form in the excimer laser gas mixture. These can have a considerable absorption effect on the laser irradiation or the pre-ionization radiation. Tests recommended by the current state of technological developments in which the energy of excimer laser radiation impulses is stabilized through the addition of gases to the gas mixture have shown disadvantageous effects on other characteristics of the laser and the emitted radiation.

Filling an excimer or molecular fluorine laser with a gas mixture of precise composition and maintaining that composition is known to be advantageous for determining significant output beam parameters. For example, KrF-excimer laser gas mixtures typically comprise around 1% Kr, 0.1% $F_2$ and a 98.9% Ne buffer. For the ArF-excimer laser, the composition is around 1% Ar, 0.1% $F_2$ and 98.9% buffer. The molecular fluorine laser typically has around 0.1% $F_2$ and 99.9% buffer gas.

The introduction of very small quantities ($\geq 0.1$ Torr) of xenon in excimer and molecular fluorine laser gas mixtures has been proposed as increasing the photopreionization yield. See R. S. Taylor and K. E. Leopold, *Transmission Properties of Spark Preionization Radiation in Rare-Gas Halide Laser Gas Mixes*, IEEE Journal of Quantum Electronics, pp. 2195–2207, Vol. 31, No. 12 (December 1995). Taylor et al. demonstrate an enhancement of spark pre-ionization intensity by the action of a Xenon additive to the gas mixture. An advantageous result of this enhancement of the preionization density is an improvement of the homogeneity of the excimer laser discharge. Taylor et al. describe qualitatively, however, that if the xenon concentration is too high, then absorption of laser radiation would occur and degrade the output laser beam. The conclusion of Taylor et al. then is that only a small amount of xenon added to an excimer laser gas mixture would enhance the preionization intensity and improve the discharge.

More recently, the use of xenon in ArF excimer lasers has been reported by Wakabayashi et al. See Wakabayashi et al., *Billion Level Durable ArF Excimer Laser with Highly Stable Energy*, SPIE's 24$^{th}$ Annual International Symposium on Microlithography, Santa Clara, May 14–19, 1999. Wakabayashi et al. describe similar results as Taylor et. al (see above), namely, an improvement of the preionization density resulting in an increased output energy at the same input discharge voltage of the ArF-excimer laser. The optimal concentration of xenon in the ArF-excimer laser gas mixture is described as 10 ppm, or the peak of the output energy versus xenon concentration curve shown at FIG. 6 of Wakabayashi et al.

SUMMARY OF THE INVENTION

It is recognized in the present invention that an advantageous value of the concentration of an additive, such as a noble gas, e.g., preferably xenon and alternatively krypton to an ArF-excimer laser gas mixture, as well preferably xenon or argon to a KrF-laser, argon or krypton to a XeCl- or XeF-laser, and xenon, argon or krypton to a $F_2$-laser gas mixture, wherein the concentration selected depends not only on its effect on the photo-preionization yield and the output energy, but also on the energy stability and overshoot control of the laser.

It is therefore an object of the invention to provide an excimer or molecular fluorine laser having a gas mixture including an appropriate concentration of the gas additive based at least in part on the effect of the concentration of the additive on improving the energy stability of the output laser beam. The energy stability is determined based on both the stability of the first pulse or first few pulses after a pause for a laser operating in burst mode, and also on the overall stability of the output energy of the laser.

It is a further object of the invention to provide the appropriate concentration of the additive gas based on the effect of the concentration of the additive on improving the overshoot control of the laser.

It is a further object of the invention to provide an excimer or molecular fluorine laser with energy attenuation control to increase the lifetimes of optical and laser tube components.

In accordance with the above objects, an excimer laser, such as a KrF- or ArF-laser, or a molecular fluorine ($F_2$) laser, preferably for high repetition rate operation such as above 1 kHz, is provided with a gas mixture including a small amount of a gas additive. The gas additive is preferably xenon. For the ArF-excimer laser, for stability reasons, the initial concentration of the gas additive is selected and may be adjusted in accordance with selected values of one or more of energy stability, overshoot control, and pulse energy.

The xenon concentration selection may be further based on the additional criteria of output pulse energy control. For example, the pulse energy may be attenuated, e.g., to advantageously lengthen the laser pulses, by decreasing the fluorine concentration in the gas mixture, and then the loss of energy may be compensated by adding an appropriate amount of xenon to the gas mixture. The pulse energy or energy dose may be regulated by controlling the amount of xenon in the gas mixture.

A gas discharge laser such as an excimer or molecular fluorine laser in accord with the present invention includes a laser tube including an electrode chamber containing a pair of elongated main electrodes and one or more preionization electrodes, and a gas flow vessel. The laser tube is filled with a gas mixture including a laser active gas or gases, a buffer and a trace amount of an additive gas for improvement of burst energy overshoot control and/or a characteristic energy stability such as standard deviation sigma, and/or peak-to-peak, pulse-to-pulse and/or dose stability, and/or adjustment of the output energy level of the laser, such as for energy attenuation control or for balancing the energy stability and/or overshoot control.

The preferred laser system is equipped with an internal gas supply unit including a supply of the additive gas, preferably a xenon supply. An output beam parameter stabilization algorithm is provided for the laser system which maintains optimal concentration of all of the gas mixture constituents including the halogen containing species, $F_2$ or HCl, and the gas additive, preferably xenon, as well as for the active rare gases Ar and Kr for the ArF-laser and the KrF-laser, respectively. Preferred gas control, composition and stabilization algorithms are described at U.S. patent application Ser. No. 09/379,034, Nos. 60/124,785, 60/159, 525, Ser. Nos. 09/418,052, 09/317,526 and No. 60/127,062 and U.S. Pat. Nos. 4,393,505 and 4,977,573, each of which is assigned to the same assignee and is hereby incorporated by reference into the present application, wherein the algorithms disclosed in the above patents and patent applications are modified in accord with the present invention to include the injection and control of the gas additive into the gas supply in the discharge chamber. Such parameters as energy stability, energy dose stability, output pulse energy and driving voltage (and/or amplified spontaneous emission (ASE) and/or features of the temporal or spatial pulse shape and/or one or more other parameters such as total accumulated energy input to the discharge, bandwidth, moving average energy dose, temporal or spatial coherence, discharge width, and long and short axial beam profiles and divergences, time, pulse count or a combination thereof) may be monitored and parameters of the output beam mentioned above and/or others are stabilized in accord with the present invention.

The control of the amount of the gas additive in the gas mixture is also preferably used to increase the lifetimes of laser components. The characteristic output power range is initially set to be higher than the desired output power of the laser system, within the range of operating driving voltages.

Then, the power is attenuated by adding more of the gas additive, preferably xenon, into the gas mixture until the output power is reduced to the desired level. As the laser components age, the amount of additive/xenon is reduced to achieve the desired output power with each new fill.

The gas additive may be added to the gas mixture from a gas container including a premix including the preferred xenon gas additive. Alternatively, xenon gas can be obtained from xenon containing crystals that are heated to dissociate the xenon containing crystals. In this embodiment, a xenon generator is filled with xenon-containing crystals and a heating element and temperature controller are used to control the xenon gas pressure.

Although xenon is the preferred gas additive, other gas additives may be used in accord with the present invention. Argon may be used as the gas additive for a KrF laser. Krypton may be used as the gas additive for an ArF laser. Argon and/or krypton may be used as the gas additive for a XeCl or XeF laser. Argon, Krypton and/or Xenon may be used for a $F_2$ laser. NO may be used for a XeCl laser (e.g., 0.1% NO in Ne). $NO_2$, $N_2O_4$, FONO or FNO may be used for a XeCl or $F_2$ laser.

Another element or molecule, such as a metal, e.g., W or Pt, may be added that would react to form one or more metal fluoride or metal chloride species, i.e., preferably WF, $WF_2$, PtF, $PtF_2$ or alternatively $WF_x$ or $PtF_x$, wherein x is preferably between three and sixteen, within the gas mixture. The metals may be added to one or more electrodes preferably of the preionization unit or another metal component of the laser tube, if any. Other candidate metals include chromium, and aluminum. Silicon, carbon, hydrogen fluoride, ozone, mercury, hafnium, metals and alloys having high vapor pressure similar to mercury and hafnium, such as are typically liquids at standard temperature and pressure (STP) may be used. Some metal oxides such as molecular combinations of oxygen and one or more of chromium, fluorine or aluminum, are other preferred candidate elements or molecular species that may be used and/or that are or will form halides (i.e., fluorides or chlorides), may be used as the gas additive, wherein xenon is herein described as being preferred.

Some particular preferred molecular combinations, either neutral or ionized or combinations of neutral and ionized species, that may be added or that may be formed by an additive reacting with the fluorine or chlorine already in the gas mixture include HF, HF, $CF_x$ (particularly $CF_4$), $CrOF_2$, CrOF, $CrO_2F$, $CrO_2F_2$, $CrO_2$, CrO, Cr, $CrF_2$, CrF, $SiF_4$, SiF, OF, $O_2F$, $OF_2$, Al, AlO, $Al_2O$, $Al_2O_2$, AlF, and $AlF_2$. Other possibilities include N, $N_2$, $N_x$, C, $C_2$, $C_x$, H, $H_2$, $H_x$, O, $O_x$ where x is a small integer above 3, such as 3–16, and combinations of any of these elements and/or molecules, as well as air itself. Any of the above mentioned elements or molecules or combinations thereof may be added to the gas mixture, preferably in trace amounts such as less than 500–1000 ppm, or less than 0.1%, in accord with the present invention.

In addition, more than one gas additive may be added to the gas mixture. For example, two or more of the additive mentioned above may be added to the gas mixture for controlling the pulse energy, energy dose, energy stability and/or overshoot control, either separately or in combination. One gas additive, or combination of gas additives, may be used to control one of these parameters or others, and another gas additive, or combination of gas additives, may be used to control another of the above parameters.

DETAILED DESCRIPTION OF THE PREFERRED EMBODIMENTS

Figure 1:
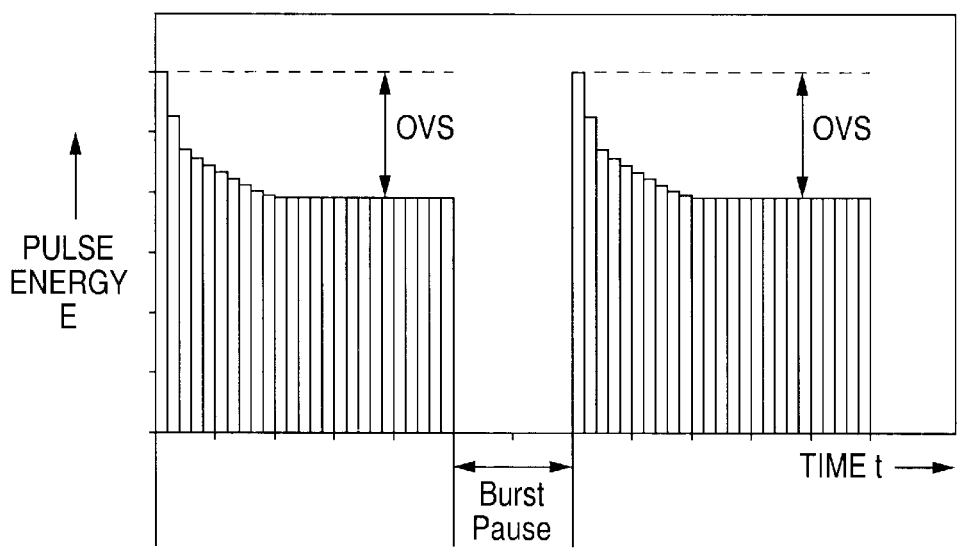
FIG. 1 illustrates energy overshoot, or spiking, for a laser operating in burst mode.

Preferred embodiments of the invention including procedures and laser systems having improved discharge homogeneity and energy stability, particularly in ArF and KrF excimer lasers and $F_2$ lasers are described below. The preferred embodiments implement the spirit of the present invention into working laser systems and are generally related to providing a gas additive, which is preferably xenon and/or may be one of the other gas additives mentioned above, to excimer and/or molecular fluorine laser gas mixtures particularly for controlling and/or stabilizing the pulse energy, energy stability, energy dose control and/or energy overshoot of these laser systems.

The invention and description below are particularly drawn to controlling and/or stabilizing these parameters of these laser systems when the laser operates in burst pattern operation, although the present invention may be applied to continuous output laser systems, as well. The invention may be applied to other excimer lasers such as XeCl, XeF and KrCl lasers, and other additives such as Ar, Kr, and others enumerated above, may be advantageous gas additives in some embodiments with some of these laser systems. The present invention is particularly drawn to lasers operating at high repetition rates such as 1 or 2 kHz pulse repetition frequency or higher.

Below are particularly described aspects of the invention including the use of a certain amount of xenon as an additive to the conventional gas mixture of an excimer or molecular fluorine laser, to design an apparatus which enables the accurate injection of the xenon to the laser gas mixture, to use gas injection and replenishment algorithms which allow the maintenance of the optimum gas mixture and xenon partial pressure in the gas mixture by computer controlled gas actions, and to use a fast energy detector to determine and control the optimum xenon partial pressure in the gas mixture, along with other gaseous constituents such as the halogen in the gas mixture (see the '034 and '785 applications incorporated by reference above).

In a preferred embodiment of the invention, both according to a preferred method and laser system, a particular amount of xenon is initially filled along with the usual constituents of the gas mixture (see the '505 and '573 patents, and the '526 and '785 applications, mentioned above) into the laser tube during a new fill. It is recognized in the present invention that adding xenon to the gas mixture effects more than one aspect of the laser system. Thus, the particular "optimal" amount of xenon initially filled into the laser tube depends on the type of laser being used and the result of adding the xenon that is desired. For example, the output energy of the laser at a particular operating discharge voltage may be advantageously enhanced or attenuated depending on the amount of xenon that is added to the gas mixture. Additionally, energy stability and overshoot control may be advantageously improved to a degree that depends on the amount of xenon that is added. Also, a particular amount of xenon maybe added according to a balance of these effected aspects of the laser system.

Argon Fluoride Laser

In a first embodiment for the ArF-excimer laser, for improving the energy stability, the concentration of xenon is greater than 10 ppm, and is as high as substantially 300–500 ppm or more. It will be shown below that the energy stability and overshoot control each improve with xenon concentration for concentrations of more than 500 ppm. It will be further shown below that the output energy at a particular discharge voltage has a maximum around 10 ppm, or that the required discharge voltage for producing output pulses at a particular energy (e.g., 5 mJ) has a minimum around 10 ppm. However, at higher concentrations of xenon, such as greater than 100 ppm, e.g., the energy stability and overshoot control are advantageously improved in accord with the present invention.

The preferred xenon concentration in this first embodiment for the ArF laser is balanced by the attenuating influence of the xenon additive on the pulse energy at these concentrations above 10 ppm. The upper limit for a particular laser system depends on limitations of the discharge circuit including the power supply, components of the pulser circuit and especially the discharge electrodes. That is, a particular pulse energy somewhere in a range from a few mJ to over 10 mJ is specified for a particular industrial application of the laser, and xenon cannot be added in amounts too high that the laser system is unable to generate pulses at that specified energy.

Preferably then, in this embodiment where the energy stability and/or overshoot control is sought to be maximized, the xenon concentration in the gas mixture is adjusted in accordance with the specified output power level and constraints of laser system components such as the power supply, pulser module and electrodes. Those system components are preferably configured to produce a higher output energy than would be desired when no xenon is added to the gas mixture, and then xenon is added to the gas mixture to attenuate the pulse energy to the desired value. Advantageously, the pulse energy is at the desired value, and the energy stability and/or overshoot is also at an improved, preferably selected, value. The system components may also be conventionally configured, and the xenon, e.g., more than 100 ppm, is added and the driving voltage increased to adjust the output energy to the selected value while again having advantageously improved energy stability and/or overshoot control in accord with the present invention.

Krypton Fluoride Laser

In a third embodiment, this time for the KrF-excimer laser, where it is desired to improve the energy stability and/or overshoot control of the output beam, the concentration of the preferred gas additive, i.e., xenon, is more than substantially 12 ppm, and preferably more than substantially 20 ppm, but less than substantially 2000 ppm, and preferably less than substantially 600 ppm. As with the first embodiment for the ArF laser, the upper limit on the xenon concentration is imposed by limitations on the power supply, pulser circuit and discharge electrodes. As improvements of these components are achieved, the xenon concentration upper limit can be raised. In a fourth embodiment, for the KrF laser, for balancing output pulse energy and the improvement to energy stability and/or overshoot control due to the xenon additive, the preferred xenon concentration range from which the particular xenon concentration is selected is a range between 100 and 500 ppm.

As discussed above, absorption and energy attenuation as a result thereof can serve to put an upper limit on the concentration of xenon in the gas mixture because it can significantly reduce the output energy of laser pulses at a particular driving discharge voltage. When the system can no longer compensate the attenuation due to additional xenon by increasing the driving voltage to maintain the specified output pulse energy, then the upper limit xenon concentration is reached. It is preferred to have as much xenon as possible in the gas mixture, within the constraints on the system components for delivering the desired output energy, for improving the energy stability and overshoot control.

Lifetime Extension of Laser Components

This attenuating effect of the gas additive in the gas mixtures of excimer and molecular fluorine lasers can be used advantageously in accord with the following embodiment of present invention to increase the lifetimes of laser components, including resonator optics components. Variations in the quality of the various laser components (e.g., optical components in the resonator such as prisms, gratings, etalons and windows, as well as the laser chamber) can lead to variations in the output power of the laser system of up to 20–40%. In addition, aging of components over their lifetimes leads to a reduction of the maximum available output power over time. This leads to operations at higher driving input voltages to achieve the same output power. The dynamic range of the operating voltage is however limited putting an upper limit on the lifetimes of the laser components.

The dependence of output power on xenon partial pressure may be advantageously used in accord with the present invention to extend these component lifetimes. The system is initially configured to have an excess of laser power when the components are new. That is, the operating range of voltages is above that typically required for generating output laser pulses at specified energies (e.g., between a few mJ to over 10 mJ). At this time, a certain amount of xenon is added to the mixture so that the output power is at the desired value within the operating voltage range.

For example, a nominal 10 W ArF laser having a <0.6 pm FWHM bandwidth at 2 kHz repetition rate may be designed to deliver a maximum power of 30 Watts. The typical dynamic operating range of the driving discharge voltage would then allow, the conventional laser to operate at a minimum of 15 W, which is 5 W above the desired 10 W power for a laser with new components. In accord with the present invention, however, a gas additive such as xenon may be added to the gas mixture in selected amounts to attenuate the laser power and bring the output power into the desired range for the operating range of the driving voltage of the laser system.

As the optical and laser tube components age, the xenon partial pressure in the gas mixture is adjusted with each new fill to a different value to achieve the same desired output power within the operating voltage range. The xenon concentration can also be adjusted between new fills according to gas control procedures described below.

An exemplary procedure in accord with this embodiment of the present invention for increasing component lifetimes is as follows. After a new gas fill of an excimer or molecular fluorine laser (without xenon), the laser is started with a nominal high voltage at the operating point of the laser and the output power or energy is measured by an energy monitor, which is typically internally configured with the laser system (see discussion regarding FIG. 7). The power for the new laser will be measured to be higher than desired, in accord with this embodiment, and so a certain amount (e.g., 10 ppm) of xenon is added to the gas mixture, and the power is measured again. The addition of xenon may be repeated and the output power measured a number of times until the output power is reduced to within the desired value within the operating range of the driving voltage.

Alternatively and advantageously, the expert system including a computer database and processor (see the '034 application, mentioned above) can store values of xenon amounts added after previous new fills and/or from previous experience with other lasers, and an estimated initial amount of xenon to be added with a present new fill can be estimated. Then, an initial amount of xenon can be added which is closer to the actual desired amount than described above, after which the repeated steps of adding small amounts (e.g., 10 ppm) of xenon and measuring the power can be performed. In this way, the overall procedure will consume less time.

In accord with this embodiment of the present invention, the amount of xenon added to the gas fill will generally decrease as the components age and the maximum output power of the laser system decreases. Since, as discussed above, the lifetimes of the laser components ends when the system can no longer achieve the desired output power even when operating at the maximum driving voltage, the advantage of adjusting the xenon concentration to control the output power is clearly set forth in this procedure of the present invention. The result is that the lifetimes of the components is advantageously increased (e.g., more than 100%).

Gas Replenishment

The gas additive concentration not only can be adjusted at a new fill, but can also be adjusted between new fills using gas replenishment procedures in accord with the present invention. For this purpose, a source of xenon is preferably integrated with the excimer or molecular fluorine laser system. That is, an internal xenon supply is provided with the laser system. Alternatively, a certain amount of xenon is mixed in a premix with an inert gas of a conventional supply of gases in gas supply bottles or containers that are external to the laser. After the initial predetermined amount of xenon is first filled into the discharge chamber at a new fill, gas replenishment techniques are preferably used in accord with the present invention to maintain the optimal xenon concentration in the gas mixture and/or to adjust the predetermined amount. An outline of preferred techniques is set forth in the '785 and '034 applications, referred to above, which are drawn particularly to halogen (and rare gas) replenishment, but may be modified to include xenon concentration control and/or replenishment in accord with the present invention.

Excimer lasers of the usual type contain a gas mixture with a total pressure that is usually less than 5 bar. The bulk of the mixture, typically 90 to 99%, consists of a so-called buffer gas. Helium and neon are typical-buffer gases. The buffer gas serves to transfer energy. The atoms of the buffer gas do not become part of the emitting, highly excited molecules in the gas discharge. The rare gas, which forms highly excited excimers, exciplexes or trimers in rare gas-halogen lasers, is found in much lower concentrations, typically in the range of 1 to 9%. The concentration of the halogen donor is typically 0.1 to 0.2%; particularly diatomic halogen molecules such as $F_2$ or HCl or other halogen-containing molecules can be used as halogen-donors. The molecular fluorine laser does not include an active rare gas in its gas mixture.

The present invention is an excimer or molecular fluorine laser system wherein the laser tube is configured to receive injections with high accuracy of predetermined small amounts of xenon as an additive to the gas mixture. Means for stabilizing the optimum xenon partial pressure are also provided. The particular techniques including micro-injections and gas replacements and pressure adjustments are disclosed in the '034 and '785 applications discussed above.

The xenon may be injected in pure form or as a constituent gas in a premix including an amount of an inert gas such as Ar, Ne, He, or Kr. In the case of the ArF and KrF lasers, a premix of 0.05% Xe in Ar and Kr, respectively, is preferred. In another preferred configuration, 1.4% Xe in Ne is used as a premix. The present invention is not however limited to the particular premix concentrations of xenon and buffer and/or other gases. As discussed below, it is preferred that the xenon gas supply be internal to the laser system, although the xenon may alternatively be supplied from external gas sources.

The xenon is injected in intervals and amounts determined based on an expert system including a processor which receives monitored values of output beam parameters and values such as energy and energy stability and on values of the high voltage. Very small amounts and short intervals are possible because the gas supply system is so configured (see the '785 application and the '514 patent, mentioned above).

Other parameters such as beam profile, temporal and spatial coherences, discharge width, time, shot or pulse count, pulse shape, pulse duration, pulse stability, bandwidth of the laser beam, or a combination of two or more of these parameters may be used. The expert system generally compares monitored values with stored values to determine whether, which type and to what extent that gas replenishment procedures are to be performed, including whether and to what extent xenon injection or replenishment is to be performed based on the monitored parameters.

Using an energy detector, the output energy and energy stability of the laser emission may measured, and in burst operation the energy overshoot may be particularly measured as the first or first few pulses of bursts of pulses. If the measured values differ from preset reference values or desired values, the amount of xenon in the laser gas mixture may be increased by xenon gas injection or reduced by gas release preferably in combination with gas injections or by mini or partial gas replacement (see the '785 application). By monitoring and controlling such parameters as laser pulse energy, energy stability and/or burst overshoot after the gas actions are performed, it is possible to determine whether the optimum concentration of xenon is in the gas mixture. By monitoring these and/or other parameters, such as ASE or temporal pulse shape (see the '052 and '062 applications mentioned above) in combination, it is possible to know both the halogen concentration and the xenon concentration in the gas mixture at any time, even though the concentrations of the xenon and the halogen may both effect some parameters such as pulse energy.

If after the gas actions are performed, it is determined that the optimum concentration of Xenon is not in the gas mixture after the laser parameters are measured, then corresponding gas actions are carried out and the control measurements of the laser parameters are repeated until the optimum xenon concentration is reached.

Condensed Matter Xenon Supply

In another embodiment of the present invention, the objects of the invention are met wherein xenon-containing condensed matter is added to the gas discharge chamber of the laser, or is in physical relation to this chamber in a manner that makes gas transport or gas diffusion possible. Such solids supply the necessary traces of xenon or xenon-containing compound to achieve the energy-stabilizing effect on the emitted laser irradiation impulses that is the goal of this invention.

Figure 2:
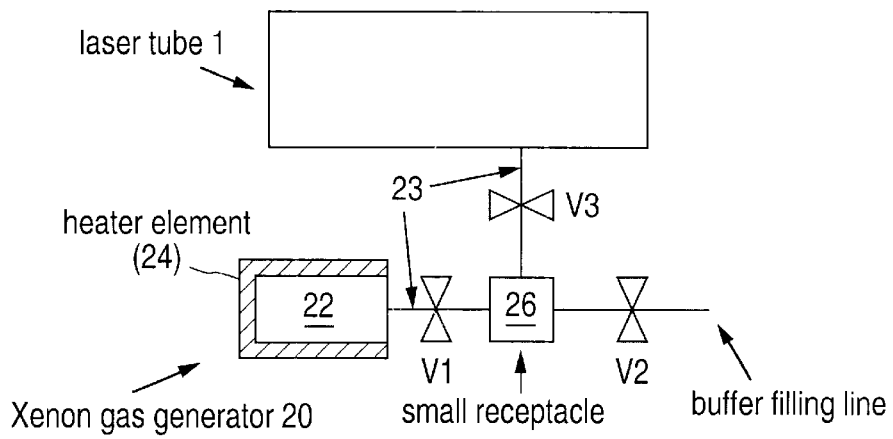
FIG. 2 shows a xenon gas generator in accord with the present invention.

In this embodiment of the present invention, xenon is preferably supplied using a solid xenon containing species such as $XeF_2$, rather than directly using a gaseous supply of xenon premix as described above. Referring to FIG. 2, a xenon gas generator 20 comprises a small container 22 which can be filled with xenon containing crystals (such as $XeF_2$). The container 22 can be connected to the laser tube 1 by at least one gas line 23. A valve or valves V1, V3 can be used to separate the container 22 from the laser tube 1. A separate receptacle 26 maybe used wherein the dissociated xenon and fluorine gases may be mixed prior to injection into the laser tube 1. Buffer gas can be used to flush the xenon fluorine mix into the laser tube 1 via valve V3. For this purpose a buffer filling line is connected through valve V2 to the receptacle 26. The receptacle 26 may be used for accurate control of the amount of xenon being injected. For this purpose, the pressures of each of the receptacle 26 and laser tube 1 are monitored prior to injection. The receptacle 26 and use thereof may be similar to or the same one as that described for gas replenishment of the halogen and active rare gases in the '514 patent and/or the '785 application, incorporated by reference above.

The container 22 is preferably equipped with a heating element 24 and a temperature control device such as a conventional temperature controller (not shown). The container 22 is preferably heated to a preset temperature that will result in dissociation of the xenon-containing molecules of the crystals. For example, $XeF_2$ would dissociate into xenon gas and $F_2$ gas. The generated gas is then filled into the laser tube 1, either directly or through the receptacle 26, as described above. The amount of released xenon depends on the temperature applied to the solid xenon compound. That is, the xenon pressure or partial pressure can be adjusted by controlling the temperature within the container 22. Any losses of xenon due to partial gas replacement can be automatically compensated by xenon release from the heated solid compound. The released amount of fluorine would not be sufficient for the laser. Thus, fluorine and other rare gases would be filled into the laser tube in the usual way from gas tanks and/or premix bottles as describe above.

An exemplary procedure for partial gas replacement in accord with the present invention is as follows. First, valve V1 is closed. A portion of the laser gas is released from the laser tube 1 in the usual way (e.g., see U.S. Pat. No. 4,977,573, which is assigned to the same assignee and is hereby incorporated by reference into the present application). Next, the halogen and active rare gases and buffer gas are filled into the laser tube 1 from gas tanks. Then, valve V1 is opened and the reduced xenon pressure is compensated, again either directly or through the receptacle 26 as described above. It may be of advantage to also connect the gas generator 20 with two gas lines to the laser tube and cycle some of the laser gas through the generator 20. In this way, stabilization of the xenon pressure can be more quickly achieved and not so limited by the diffusion rate of xenon from the generator 20 to the laser tube 1.

The xenon or the xenon-containing substance can be injected directly into the gas mixture or added to one of the gas components before filling, for instance to Ne, Kr, Ar, He or $F_2$. If xenon or a xenon-containing substance is added to the gas discharge chamber in the form of a solid in accord with this embodiment in order to create the aforementioned low xenon concentration in the gas discharge, condensed xenon fluorides (for instance $XeF_2$, $XeF_4$, $XeF_6$) are particularly envisaged for this purpose and are introduced into the laser chamber beforehand or form during operation of the laser. It has been shown that measurable amounts of such substances (xenon fluorides) can accumulate inside the laser chamber during operation (condensation), if the laser is operated with a fluorine-containing gas mixture in which xenon or xenon-containing compounds are present (e.g. XeF*). In this case, the aforementioned condensable xenon fluoride is formed during operation of the laser and remains in the laser chamber. It later provides the aforementioned traces of xenon in the gas mixture, even when the laser is no longer supplied with xenon from external sources. The remains of the xenon-containing solid in the gas discharge chamber supply the necessary concentrations in the ppm range for stabilization of the impulse energy during further laser operation (without further addition of xenon for several subsequent gas fills).

The invention is therefore also implemented when an excimer or molecular fluorine laser is prepared and operated in such way that it is operated with a gas mixture containing fluorine in the presence of xenon and is thereafter operated without the addition of further xenon (in ppm range), but because of the previous operation, there is still a sufficient trace of xenon in the gas mixture.

Experimental Results

Figure 3A:
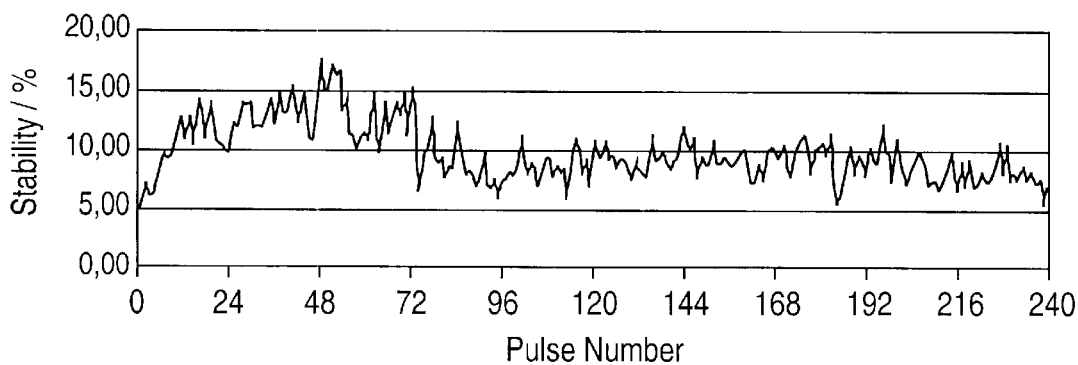
FIG. 3a shows a pulse-to-pulse energy stability over a large number of bursts of 240 pulses for a conventional KrF laser system.

FIG. 3a shows a pulse-to-pulse energy stability over a large number of bursts each including about 240 pulses for a KrF laser system without any xenon additive in its gas mixture. The KrF laser was operated at 2 KHz and the bursts followed a 0.8 second pause. The pulse energy stability is depicted as a percentage deviation from the steady-state average. The pulse-to-pulse energy stability of the KrF laser having a conventional gas mix without a xenon additive is shown in FIG. 3a to vary from a minimum around 5% to over 15%. The stability is particularly poor over the first 70 pulses or so, where it fluctuates between 10% and 15%. After the first 70 pulses, the stability settles into a range between about 7% and 12%.

Figure 3B:
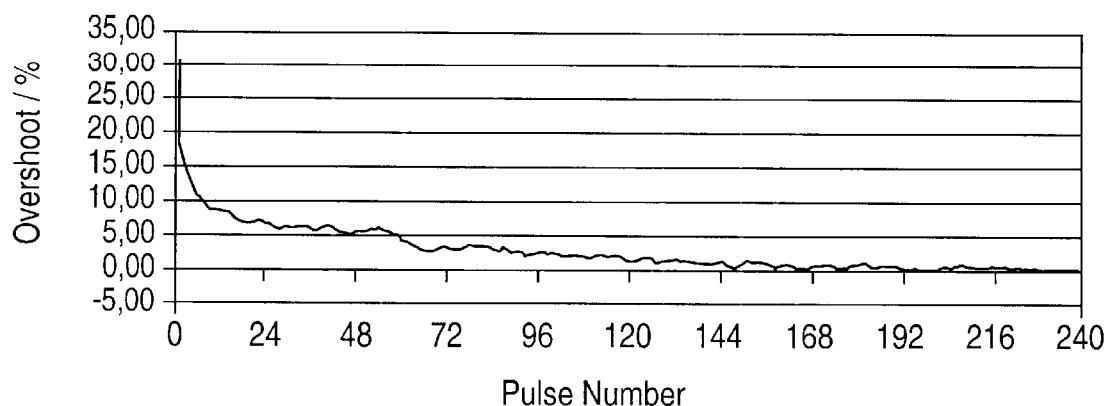
FIG. 3b shows the energy overshoot of a conventional burst mode operation KrF laser as a percentage over the steady state output energy over entire bursts including around 240 pulses.

FIG. 3b shows the energy overshoot of the laser of FIG. 3a as a percentage over the steady state average output energy over entire bursts each including around 240 pulses. The overshoot of the KrF laser having a conventional gas mix without a xenon additive is shown in FIG. 3b to be around 30% for the first pulse or pulses and rapidly decreases to around 10% after 5–10 pulses, and to around 5% after around 25 pulses. The overshoot is then shown to decrease somewhat more smoothly over the remainder of the burst. At the last 50–100 pulses, the overshoot effect on the pulse energies is finally reduced substantially to zero, i.e., the steady-state value is reached.

Figure 4A:
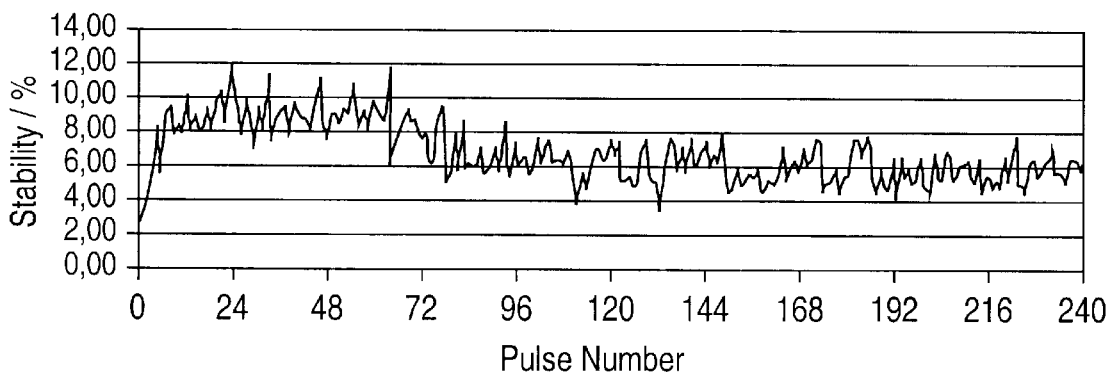
FIG. 4a shows a pulse-to-pulse energy stability over the same number of bursts of 240 pulses as FIG. 2a for a KrF laser system in accord with the present invention.

FIG. 4a shows a pulse-to-pulse energy stability as in FIG. 3a over a large number of bursts each including about 240 pulses for a laser system in accord with the present invention as a percentage over the steady-state average. The laser system of the present invention whose output pulse energies were measured and plotted in FIG. 4a was the same used for FIG. 3a and had a gas mixture including about 35 ppm of a xenon additive to an otherwise typical KrF laser gas mixture. The KrF laser was again operated at 2 KHz and measured bursts followed an 0.8 second pause. The pulse-to-pulse energy stability for the KrF laser having 35 ppm of a xenon additive in its gas mix is shown in FIG. 4a to vary from a minimum just below 4% to no more than 12%. Except for a few peaks in the first 60–70 pulses, the stability is shown to be below 10% over these first pulses where overshoot is typically most pronounced. After the first 60–70 pulses, the stability settles into a range between about 3% and 8%.

Figure 4B:
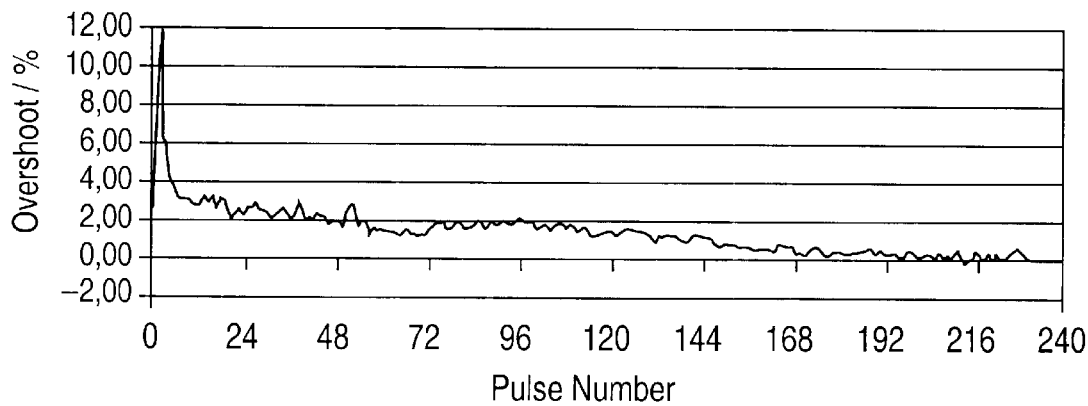
FIG. 4b shows the energy overshoot of a burst mode operation KrF laser in accord with the present invention as a percentage over the steady state output energy over entire bursts including around 240 pulses.

FIG. 4b shows the energy overshoot of a burst mode operation KrF laser in accord with the present invention as a percentage over the steady state output energy over entire bursts each including around 240 pulses. As with FIG. 4a, the laser system of the present invention whose output pulse energies were measured and plotted in FIG. 4b had a gas mixture including about 35 ppm of a xenon additive to an otherwise typical KrF laser gas mixture. Again, the KrF laser was operated at 2 KHz and the measured burst followed a 0.8 second pause. The overshoot is shown in FIG. 4b to be around 9–10% for the first pulse or pulses and rapidly decreases to around 3% after 5–10 pulses, and to around 2% after around 20 pulses. The overshoot is then shown to decease over the remainder of the burst, and at the last 50–100 pulses, the overshoot effect on the pulse energies is decreased substantially to zero.

At least two major improvements in the output energy stability are observed for the laser having the Xe-additive in its gas mixture used for measuring the data of FIGS. 4a–4b over the laser not having the xenon additive used for measuring the data of FIGS. 3a–3b. First, the pulse-to-pulse energy stability shown in FIG. 4a for the laser using the gas mixture with the 35 ppm xenon additive is at all points less than 12% deviation, and less than 10% deviation for most of the laser pulses at the beginning of the burst, and less than 8% after 100 pulses. The stability demonstrated by the laser in FIG. 4a is a significant improvement compared to the laser of FIG. 3a operating without xenon, wherein the energy stability is observed to be as high as 18% for some pulses, is at around 15% for pulses at the beginning of the burst and remains around 10% after the first 100 pulses. Second, the burst overshoot defined as the average deviation of the first pulse in the burst from the steady-state energy value is reduced from 30% for the laser of FIG. 3b operating without xenon to less than 10% for the laser of FIG. 4b operating with xenon.

Figure 5:
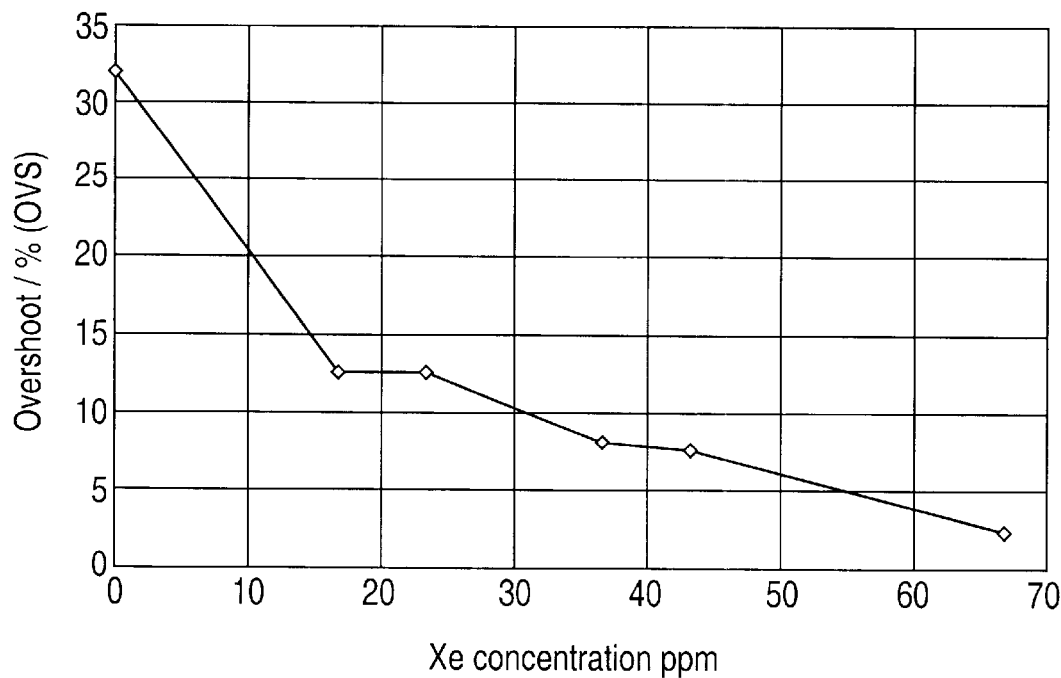
FIG. 5 shows the dependence on xenon concentration of the energy overshoot of a KrF laser operating in burst mode as a percentage over the steady state output energy of an entire burst.

FIG. 5 shows the dependence of the energy overshoot on the xenon partial pressure in the gas mixture of a KrF laser. FIG. 5 indicates a strong improvement of the overshoot already at very small xenon concentrations. That is, the overshoot decreases from 32% for no xenon additive, as already indicated at FIG. 3b, to 12–13% at around 17 ppm xenon. A reduction of the overshoot to 8% is observed at around 37 ppm xenon, and a further reduction to 2–3% is shown for a 67 ppm xenon concentration.

In obtaining the experimental results that follow in Table 1, a KrF excimer laser was operated at a repetition rate of 1 kHz. A laser of the type Lambda Physik Litho/P was being used. The total gas pressure was 3 bar absolute. The individual components in the gas mixture were present in approximately the following concentrations: 0.1% $F_2$, 1% Kr, 98.9% neon and a trace of xenon in the range of 10–500 ppm. Pre-ionization was carried out with UV sparks although corona preionization is also typically used in KrF, as well as ArF and $F_2$ laser systems. The applied high voltage used during the testing was of the order of 15 kV. Results the experiment were as follows:

TABLE 1

| Xenon Concentration (in ppm) | Pulse Energy (relative units) | Standard Deviation (%) |
| --- | --- | --- |
| 0 | 1 | 1.32 |
| 49 | 0.94 | 0.91 |
| 82 | 0.88 | 0.81 |
| 122 | 0.84 | 0.81 |
| 163 | 0.80 | 0.86 |
| 204 | 0.75 | 0.83 |
| 334 | 0.66 | 0.88 |
| 484 | 0.58 | 0.94 |

The above experimental results show that for the excimer laser used and under given operating conditions, there is an optimum standard deviation of 81% (as is usual, the standard deviation is calculated as the square root of the mean of the squared deviation of the variables from their mean). At the optimal stability, the pulse energy fell slightly, but in a large number of applications, the advantage of stabilization of the energy from the emitted laser beam impulses outweighs this slight decrease in output energy, which is compensated by increasing the high voltage in those applications.

Figure 6A:
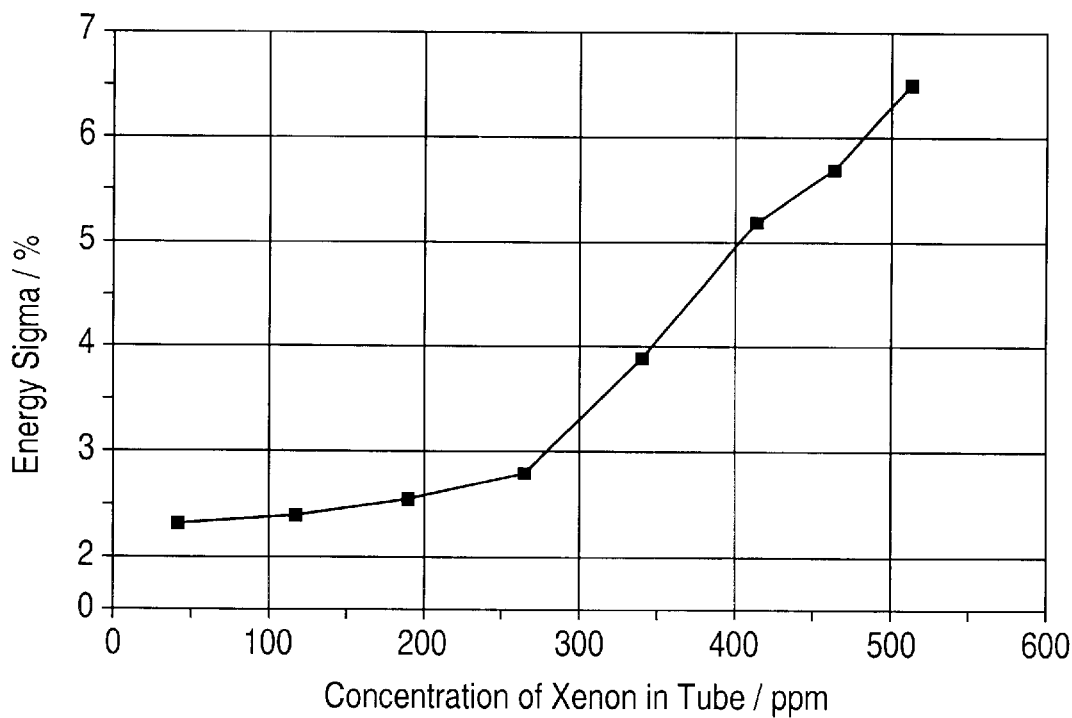
FIG. 6a shows a measured dependence on xenon concentration from 30 to 520 ppm of the energy stability of a KrF laser operating in burst mode as the inverse of the percentage deviation from the steady state output energy of the laser.
Figure 6B:
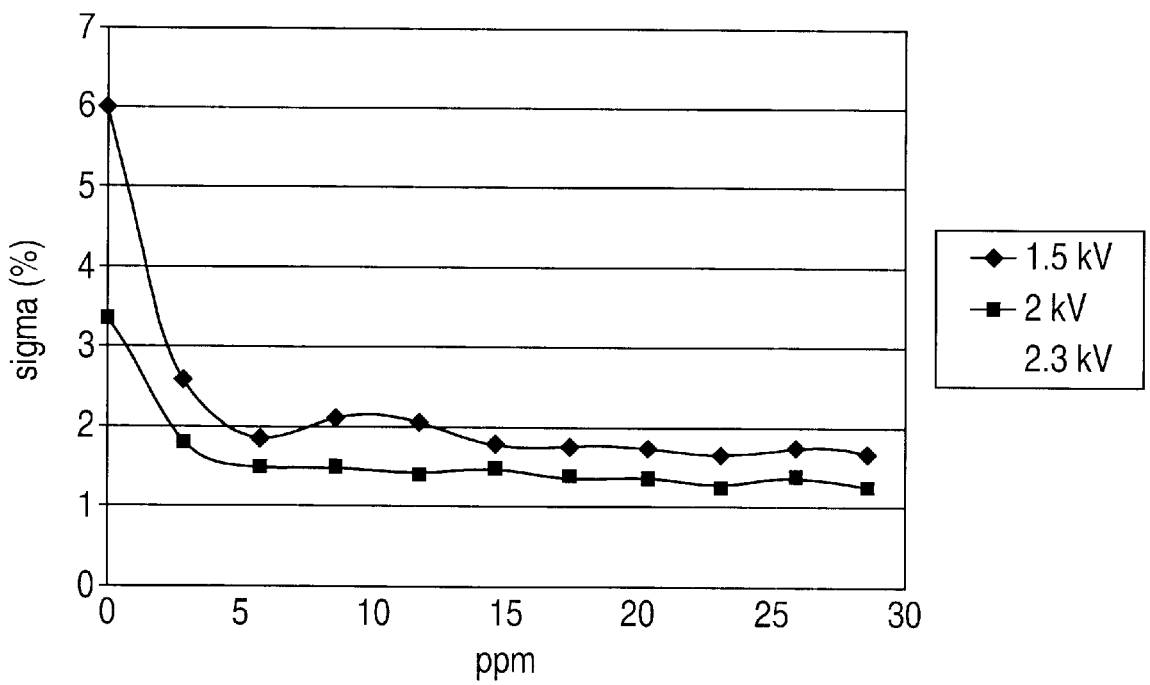
FIG. 6b shows a measured dependence on xenon concentration from 0 to 30 ppm of the energy stability of a KrF laser operating in burst mode as the percentage deviation from the steady state output energy of the laser.

FIG. 6a shows a measured dependence on xenon concentration of the energy stability sigma of an ArF laser, operating in burst mode and having a bandwidth less than 0.6 pm, as an inverse of the percentage deviation from the steady state output energy of the laser for xenon concentrations above, around 30 ppm. FIG. 6b shows a measured dependence on xenon concentration of the energy stability sigma of an ArF laser as the percentage deviation from the steady state output energy for concentrations below 30 ppm. The energy stability is shown in FIG. 6b to improve drastically when only a few ppm of xenon are added to the gas mixture, and is shown in FIG. 6a to improve steadily with increasing xenon concentration thereafter.

Figure 6C:
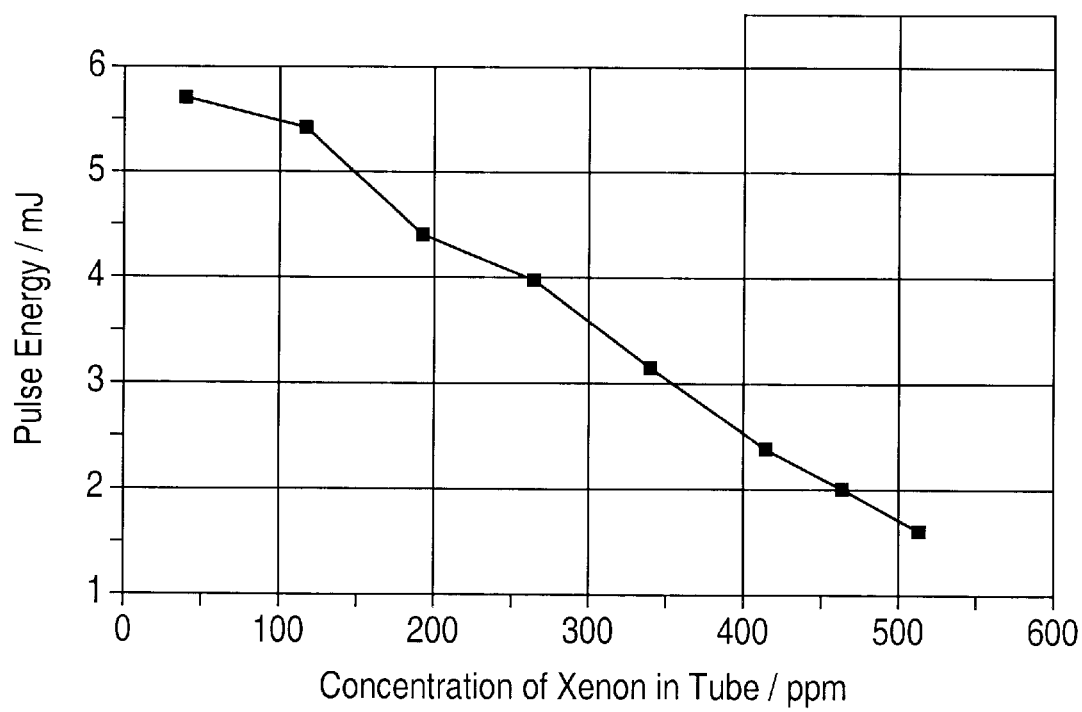
FIG. 6c shows a measured dependence on xenon concentration from 30 to 520 ppm of the output pulse energy of a KrF laser at constant discharge voltage.
Figure 6D:
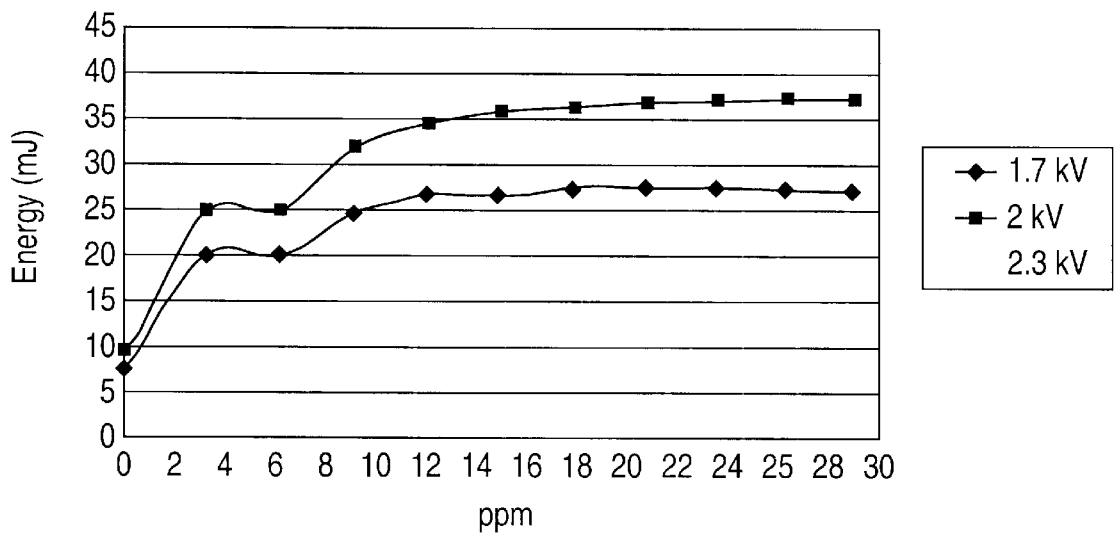
FIG. 6d shows a measured dependence on xenon concentration from 0 to 30 ppm of the output pulse energy of a KrF laser at constant discharge voltage.

FIG. 6c shows a measured dependence on xenon concentration from 30 to 520 ppm of the output pulse energy of the ArF laser of FIGS. 6a–6b at constant discharge voltage. FIG. 6d shows a measured dependence on xenon concentration from 0 to 30 ppm of the output pulse energy of the ArF laser of FIGS. 6a–6c. The pulse energy is shown at FIG. 6d to improve drastically when a few ppm of xenon are added to the gas mixture. The pulse energy is then shown to attenuate substantially linearly from about 5.7 mJ at 30 ppm xenon to around 1 mJ at just over 500 ppm xenon.

Adding traces of the rare gas xenon has no observed negative effects on the quality of the gas discharge. Only unstable XeF* or stable $XeF_2$, $XeF_4$ or $XeF_6$ is formed in the gas discharge.

Figure 6E:
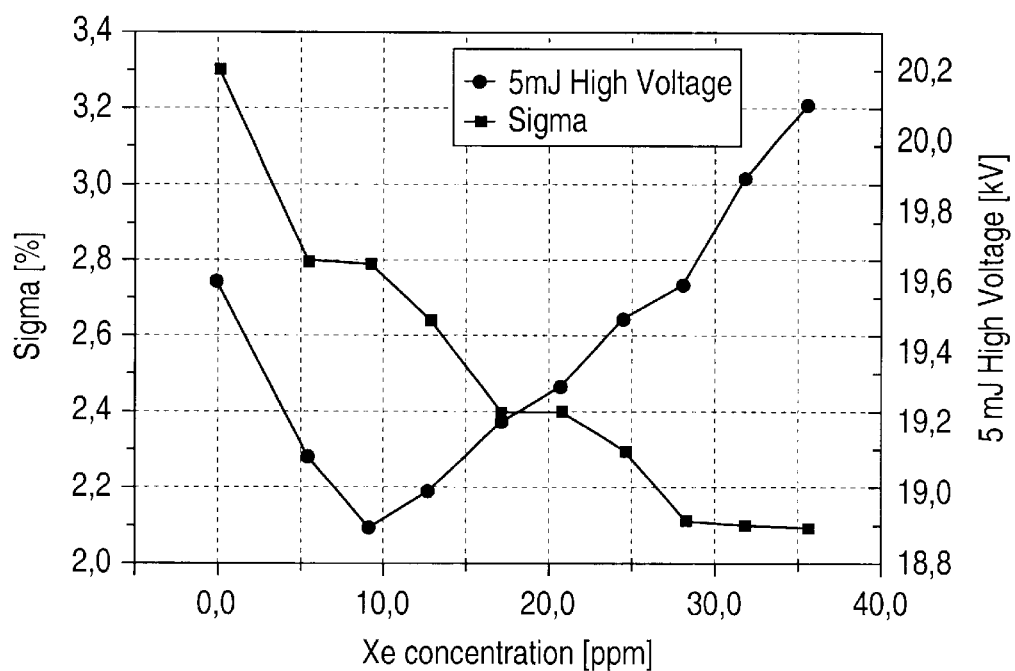
FIG. 6e shows measured dependences of the output energy and energy stability sigma on the xenon concentration in an ArF laser gas mixture, where the output energy dependence is shown by depicting the discharge voltage needed to maintain 5 mJ output energy.

FIG. 6e illustrates the influence of xenon on the output energy and the energy stability of an ArF excimer laser used for 193 nm lithography at xenon concentrations below 40 ppm. The dependence of the output energy is shown by depicting the high voltage needed to maintain 5 mJ output energy. The dependence of the output energy on the Xenon concentration is qualitatively similar to the results obtained by Wakabayashi et. al. (see above). FIG. 6e shows that the xenon concentration which produces maximum output energy, or which requires the lowest high voltage to maintain the 5 mJ output energy, is at or just slightly below around 10 ppm. At 10 ppm, the required high voltage is around 1.8.9 kV. At xenon concentrations above and below 10 ppm, the high voltage required to maintain the 5 mJ output energy increases. For example, at 0 ppm and again at around 28 ppm, the required high voltage is around 19.6 kV. At xenon concentrations above 28 ppm, the high voltage continues to increase;

The output energy stability is, however, improved at xenon concentrations above 10 ppm, and continues to improve at xenon concentrations as high as 35 ppm. As shown in FIG. 6e, the energy stability sigma is around 3.3% at 0 ppm xenon Concentration. The energy sigma improves to around 2.4% between around 17 ppm to 21 ppm. The energy sigma improves further to 2.1% around 28 ppm. Based on these data, it is recognized in the present invention that the optimal xenon concentration is above that which produces the lowest required high voltage to maintain the 5 mJ output energy, but below that which produces a required high voltage that is significantly increased from that minimum. The optimal xenon concentration, for an embodiment of the invention which seeks to improve the combination of the energy stabilty sigma and the output pulse energy, is thus based on both of the plots shown in FIG. 6e, i.e., the high voltage and the energy sigma versus xenon concentration graphs. The optimal xenon concentration for the laser system of this preferred embodiment is thus between around 10 ppm and 30 ppm for the ArF laser.

As FIG. 6e shows, the energy stability is significantly improved to below 2.8% and is at less than 2.7% for a xenon concentration of 12 ppm. The energy stability improves at still higher xenon concentrations. Thus, in accord with the present invention, an ArF laser is provided having a xenon concentration of 12 ppm or higher. This improved energy stability is particularly advantageous for an excimer laser for use in combination with an imaging system for photolithographic applications. A similar improvement of the energy stability is expected for the 157 nm molecular fluorine ($F_2$) laser when small amounts of a gas additive, such as xenon, are added to the gas mixture. The specific optimal concentration of xenon is based on a similar study of sigma and high voltage versus xenon concentration graphs measured using a molecular fluorine laser.

Preferred Laser System

Figure 7:
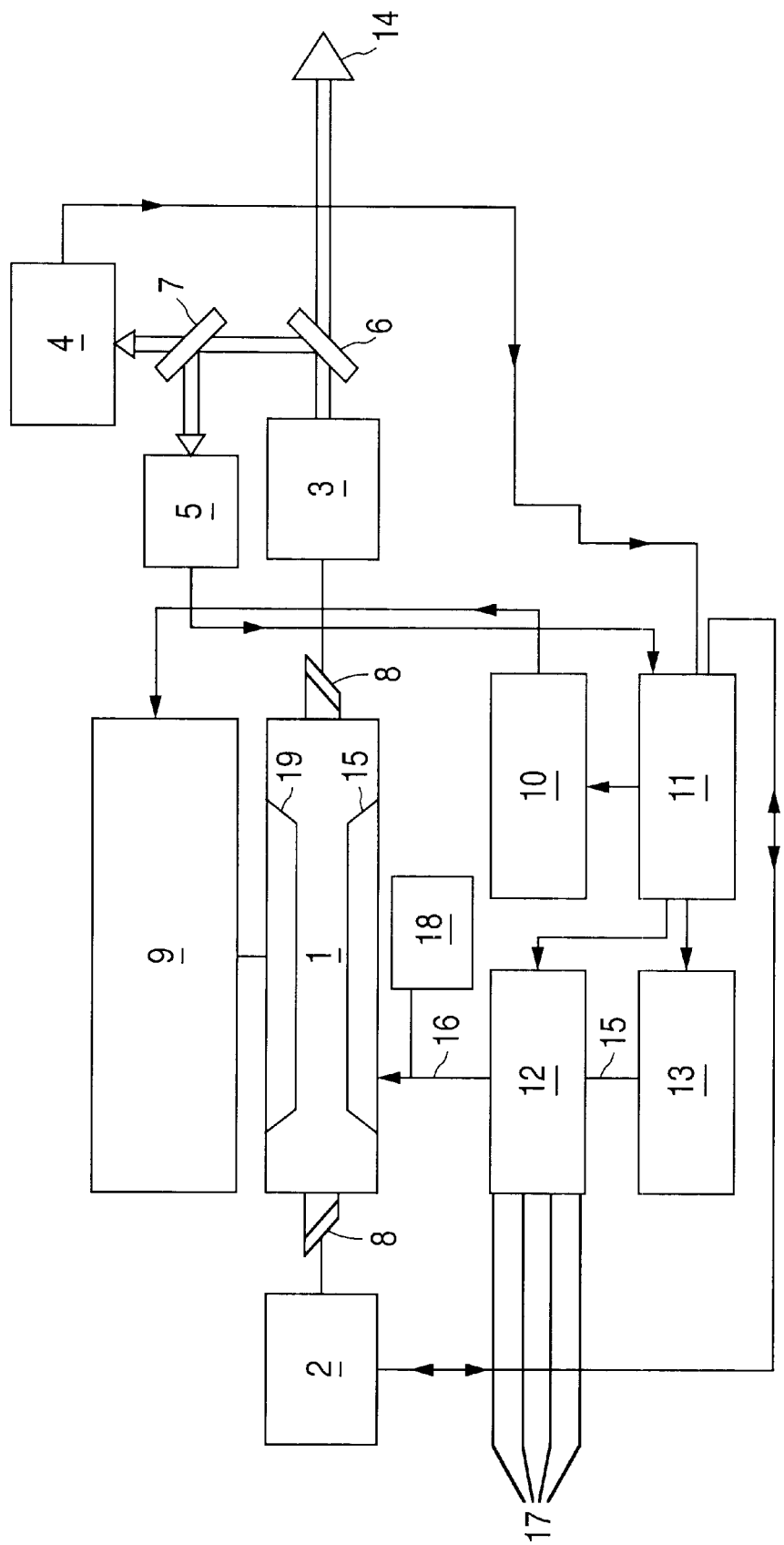
FIG. 7 shows a preferred embodiment of a KrF, ArF or $F_2$ laser system in accord with the present invention.

A preferred embodiment of a KrF, ArF or $F_2$ laser system in accord with the present invention is shown in FIG. 7. FIG. 7 shows various modules of an excimer or molecular fluorine laser for deep ultraviolet (DUV) or vacuum ultraviolet (VUV) lithography using radiation around 248 nm, 193 nm or 157 nm, respectively. The discharge chamber 1 contains a laser gas mixture and includes a pair of main discharge electrodes 1a, 1b and one or more preionization electrodes (not shown). Exemplary electrode configurations are described at U.S. provisional patent application No. 60/128,227, which is assigned to the same assignee as the present application and which is hereby incorporated by reference into the present application. Exemplary preionization assemblies are described in U.S. patent application Ser. No. 09/247,887, Nos. 60/160,182 and 60/162,645, each of which is assigned to the same assignee as the present application and which is hereby incorporated by reference into the present application.

The laser resonator which surrounds the discharge chamber 1 containing the laser gas mixture includes a line narrowing module 2 for a line narrowed excimer or molecular fluorine laser, which may be replaced by a high reflectivity mirror or the like if line-narrowing is not desired, and an outcoupling module 3. Depending on the type and extent of line-narrowing and/or selection and tuning that is desired, and the particular laser that the line-narrowing module is to be installed into, there are many alternative line-narrowing configurations that may be used. For this purpose, those shown in U.S. Pat. Nos. 4,399,540, 4,905,243, 5,226,050, 5,559,816, 5,659,419, 5,663,973, 5,761,236, and 5,946,337, and U.S. patent application Ser. Nos. 09/317,695, 09/130,277, 09/244,554, 09/317,527, 09/073,070, Nos. 60/124,241, 60/140,532, and 60/140,531, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, all of which are hereby incorporated by reference into the present application.

The discharge chamber is sealed by windows 8 transparent to the wavelengths of the emitted laser radiation 14. After a portion of the output beam passes the outcoupler 3, that output portion impinges upon a beam splitter 6 which reflects a portion of the beam to a second beam splitter 7. A portion of the beam impinging the second beam splitter then reflects to a fast energy detector 5 and the remainder traverses the beam splitter and is received by a bandwidth and wavelength meter 4. The portion of the outcoupled beam which traverses the beam splitter 6 is the output emission of the laser, which propagates toward an industrial or experimental application such as a light source for photolithographic applications.

A pulse power module 9 and high voltage power supply 10 supply electrical energy to the main electrodes 1a, 1b to energize the gas mixture. The preferred pulse power module and high voltage power supply are described at U.S. patent application Ser. Nos. 08/842,578, 08/822,451, and 09/390,146, each of which is assigned to the same assignee as the present application and which is hereby incorporated by reference into the present application.

A processor or control computer 11 receives and/or processes values of the energy, energy stability, wavelength, and bandwidth of the output beam and controls the line narrowing module to tune the wavelength, and controls the power supply components 9 and 10 to control the energy. In addition, the processor 11 controls the gas supply unit which includes gas supply valves 12 and a gas additive supply 13, which may be internal or external to the laser system. For the KrF laser, a gas additive supply of preferably xenon is internal to the laser system. For the ArF laser, a gas additive supply of preferably xenon is maintained external to the laser system, such as along with the external gas supply (not shown) of the other gases of the system such as the halogen containing gas, the active rare gas and the buffer gas via gas tubing 17. Alternatively, the ArF laser may have an internal supply of xenon or another gas additive, or an external supply of a gas additive other than xenon. The KrF laser may have an external supply of xenon or another gas additive, or an internal supply of xenon. The xenon and/or other gas additive is connected to the gas supply valves via appropriate gas tubing 15. The gas supply valves are connected to the laser tube via other gas tubing 16 which is/are preferably connected to a vacuum pump 18 or other low pressure source.

As described in the '875 application with respect to the halogen containing and other gases of the system, when the processor determines that a xenon injection is to be performed, a compartment is first filled with the xenon to a prescribed pressure (for this purpose, U.S. Pat. No. 5,396,514, which is assigned to the same assignee as the present application is hereby incorporated into the present application by reference; see also the '785 application referred to above). Then the xenon is injected into the tube 1. By way of this method, considering the pressure in the tube 1 and that in the compartment filled with xenon, as well as the volume of the compartment, it is possible to determine more precisely how much xenon has been injected into the tube. The system also includes means for releasing gas including xenon from the tube 1 should it be desired to reduced the pressure in the tube 1, or should a partial pressure of one of the gases such as the xenon be determined to be too high, or if a gas replenishment action such as partial gas replacement or mini gas replacement such as are described in the '785 application is to be performed, or if a new fill is to be performed.

As mentioned, the gas compartment of the laser preferably contains a source or supply of xenon 13. The xenon source 13 is connected with gas tubings 15 and if necessary additional valves to the gas supply valves 12. The standard gas mixture is supplied to the laser by external gas supply via the gas supply tubings 17.

A new fill of the laser is controlled automatically by the control computer 11. In the present invention xenon gas from the xenon source 13 is injected into the discharge chamber 1 with high accuracy during the new fill. The injection may be carried out in a preferred version of the invention just after having reduced the pressure in the discharge chamber 1 to a preset low value pressure, e.g., around 20–30 mbar, before the new gas fill is started. In another preferred example of the invention the xenon injection is carried out at the end of the new fill when the standard gas mixture has already been filled.

The present invention including the addition of xenon to the gas mixture at predetermined concentrations is particularly advantageous when operating at high repetition rates. That is, performance of the laser at moderate repetition rates (e.g., well below 1 kHz such as from 1 to 300 or 500 Hz) is not observed to change as advantageously with the addition of Xe in the mixture as when operating at high repetition rates such as 1 kHz and above. The behavior of the laser at high repetition rates (about 1 kHz and higher) with the addition of the xenon is significantly improved and the power of the laser at the higher repetition rates was nearly linear and the pulse to pulse energy stability (standard deviation) was better.

Proper operation of the laser at the high repetition rates depends on the various factors. Repetitive and very intense periodic gas discharges in the discharge chamber 1 is improved by continuous refreshing of the gas in the area between the electrodes. Intense gas flow between the electrodes 1a, 1b is not the only important condition, though, and the present invention demonstrates that the gas mixture composition including maintaining precise constituent gas concentrations is important.

The pulse to pulse energy stability of the laser output radiation also strongly depends on the kinetics of the gas discharge processes, of the laser excitation, on the specific features of the building up processes of the laser pulse as well as on the ordinary stability of the electrical pulse generator, used for the pumping of the electrical discharge. The increase of the intensity of the preionization of the gas, which is advantageously achieved in the present invention by adding trace amounts of xenon to the gas mixture according to prescribed concentrations, provides significant improvement to the pulse to pulse stability.

It has been shown in our experiments that the objects of the invention have been met. Additions of small amounts of xenon improves the laser operation, particularly when maintained at precise concentrations, with particular advantage at the high repetition rates. That is, the improvement of laser performance at high repetition rates, with particular reference to the pulse to pulse energy stability (standard deviation), is advantageously achieved.

Objects of the Invention Met

The several embodiments of the present invention set forth above meet the objects of the invention by controlling the concentration of a xenon additive to the gas mixture of an excimer or molecular fluorine laser to control the pulse energy, energy stability and overshoot control of the laser. The laser comprises an apparatus for supplying xenon to the laser gas mixture and procedures to inject and control the appropriate xenon amount in the gas mixture of the gas discharge vessel of the laser. The present invention achieves an optimal balance between the highest energy stability and overshoot control and the energy output of the laser depending on constraints imposed by other components of the laser system and desired beam parameter specifications. The present invention may also be used to increase the lifetimes of its components as set forth above.

These features of the present invention are achieved in the present invention based on an investigation of the energy stability, overshoot control and output power dependencies of the Xenon concentration in the laser chamber. Experimental data are now detailed to illustrate the advantages explained above with regard to the particular embodiments of the present invention.

The amount of traces of xenon or xenon-containing compound in the gas mixture of the excimer laser in this invention only refers to such fluorine-containing excimer laser gas mixtures that do not contain larger amounts of xenon for other reasons, for instance because the exciplexes contain xenon (e.g. XeF or XeCl). The concentrations of xenon added to the gas mixture in accord with the present invention (less than 2000 ppm for KrF and significantly less for ArF lasers) do not make such xenon-containing gas mixtures in excimer lasers the subject this invention.

The optimal concentration of traces of xenon in the gas mixture referred to in this invention depends on the characteristics and conditions of the excimer laser in individual cases and cannot be prescribed for every type of excimer laser in terms of the optimal values: optimal xenon concentration for each type of laser must be determined experimentally. For example, the invention delivers particularly good results when the excimer laser is operated at a relatively high repetition rate, particularly at a repetition rate greater than 100 Hz, and especially when greater than 500 Hz.

As is described above, the concentration of the xenon or the substance that supplies xenon is not advantageously increased indefinitely into the gas mixture, but reaches an optimal value that is dependent on various laser parameters and also varies among types of lasers with respect to the gas mixture used, type of preionization, configuration of the electrical gas discharge (in particular the electrode geometry and the condition of the electrodes), and the external electrical circuit. The concentration may simply be optimized empirically for each laser type.

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. The scope of the invention is thus not limited by the particular embodiments described above. Instead, the scope of the present invention is understood to be encompassed by the language of the claims that follow, and structural and functional equivalents thereof.

What is claimed is:

1. An excimer or molecular fluorine laser, comprising:
   a discharge chamber initially filled with a gas mixture at least including molecular fluorine, a buffer gas and an amount between 100 ppm and 2000 ppm of xenon;
   a plurality of electrodes in the discharge chamber connected to a discharge circuit for energizing the gas mixture by applying predetermined driving voltages to the electrodes at a repetition rate of at least one kilohertz;
   as resonator including a line-narrowing and wavelength tuning module and the discharge chamber for generating an output laser beam at a specified energy,
   a gas supply unit coupled with the discharge chamber and configured to permit a quantity of a molecular fluorine/buffer gas mixture less than two mbar to inject into said discharge chamber at selected intervals;
   an energy detector for monitoring energies of the output beam;
   a wavelength meter for monitoring wavelengths of the output beam;
   a processor for receiving values of the energies and wavelengths and including a signal indicative of a concentration of the molecular fluorine in the gas mixture, the processor controlling the line-narrowing and wavelength tuning module to tune the wavelength, the discharge circuit to control the energy of the output beam and the gas supply unit to control the concentration of the molecular fluorine in the gas mixture, and
   wherein values of the predetermined driving voltages are selected by the processor based on the received values of the energies, and wherein the amount of the xenon in the gas mixture is selected to provide enhanced pulse-to-pulse energy stability, such that the overall stability of output beam parameters including pulse-to-pulse energy stability and wavelength is enhanced, and wherein the selected values of the predetermined driving voltages are influenced by the presence of the xenon in the gas mixture for providing the output beam at the specified energy.

2. The laser of claim 1, wherein the gas mixture further includes argon as an active rare gas such that the laser comprises an ArF gas mixture.

3. The laser of claim 1, wherein the gas mixture further comprises krypton as an active rare gas such that the laser comprises a keypton fluoride gas mixture.

4. An excimer or molecular fluorine laser system for generating an output beam at a specified energy, comprising:
   a discharge chamber initially filled with a gas mixture at least including molecular fluorine and a buffer gas, and a trace amount between 10 ppm and 2000 ppm of an attenuating gas additive for attenuating the output beam to said specified energy;
   a plurality of electrodes in the discharge chamber connected to a discharge circuit for energizing the gas mixture by applying electrical pulses at predetermined driving voltages to the electrodes at a repetition rate of at least one kilohertz;
   a resonator including a line-narrowing and wavelength tuning module and the discharge chamber for generating said output beam at said specified energy;
   a gas supply unit coupled with the discharge chamber and configured to permit a quantity of a molecular fluorine/buffer gas mixture less that two mbar to inject into said discharge chamber at selected intervals;
   an energy detector for monitoring energies of the output beam;
   a wavelength meter for monitoring wavelengths of the output beam;
   a processor for receiving values of the energies and wavelengths and including a signal indicative of a concentration of the molecular fluorine in the gas mixture, the processor controlling the line-narrowing and wavelength tuning module to tune the wavelength, the discharge circuit to control the energy of the output beam and the gas supply unit to control the concentration of the molecular fluorine in the gas mixture, and
   wherein values of the predetermined driving voltages are selected by the processor based on the received values of the energies, and wherein the trace amount of the attenuating gas additive is selected to provide enhanced pulse-to-pulse energy, stability, such that the overall stability of output beam parameters including pulse-to-pulse energy stability and wavelength is enhanced, and wherein the selected values of the predetermined driving voltages are increased due to the presence of the attenuating gas additive for providing the output beam at the specified energy.

5. The laser of claim 4, wherein the gas mixture further includes argon as an active rare gas such that the laser comprises an ArF gas mixture:
   wherein the concentration of the gas additive in the gas mixture is adjusted to control the control the energy stability of the laser beam.

6. The laser of claim 5, wherein the concentration of the gas additive in the gas mixture is also adjusted to control the energy overshoot of the laser beam when the laser is operating in burst mode.

7. The laser of claim 4, wherein the gas mixture further includes argon as an active rare gas such that the laser comprises an ArF gas mixture:
   wherein the concentration of xenon in the gas mixture is adjusted to control the energy overshoot of the laser beam when the laser is operating in burst mode.

8. The laser of any of claims 6–7, wherein the energy overshoot is controlled to be less than 20% by adjusting the concentration of the gas additive.

9. The laser of any of claims 6–7, wherein the energy overshoot is controlled to be less than 10% by adjusting the concentration of the gas additive.

10. The laser of any of claims 6–7, wherein the energy overshoot is controlled to be less than 5% by adjusting the concentration of the gas additive.

11. The laser of any of claims 5–7, wherein the concentration of the gas additive in the gas mixture is also adjusted to control one of the pulse energy and the energy dose of the laser beam.

12. The laser of claim 4, wherein the gas mixture further includes argon as an active rare gas such that the laser comprises an Arf gas mixture:
wherein said output laser beam has a specified energy, and wherein the discharge circuit is configured to apply an operating driving voltage to the electrodes only in a range at or above a minimum driving voltage which when applied to the electrodes would produce a laser beam above said specified energy without the attenuating gas additive in the gas mixture.

13. The laser of any of claim 5, 7 or 12, wherein the attenuating gas is selected from the group consisting of xenon, krypton, $WF_x$, $PtF_x$, a chromium-containing species, an aluminum-containing species, a silicon-containing species, HF, $HF_2$, ozone, mercury, hafnium, $CRO_x$, $FO_x$, $AlO_x$, $HF_x$, $CF_2$, $CF_4$, $CF_6$, $CF_8$, $CF_3$, $CrOF_2$, $CrOF$, $CrO_2F$, $CrO_2F_2$, $CrO_2F_2$, $CrO_2$, $CrO$, $Cr$, $CrF_2$, $CrF$, $SiF_4$, $SiF$, $OF$, $O_2F$, $OF_2$, $Al$, $AlO$, $Al_2O$, $Al_2O_2$, $AlF$, $AlF_2$, N, $N_2$, $N_x$, C, $C_2$, $C_x$, H, $H_2$, $H_x$, O, and $O_x$, where x is an integer from 3–16.

14. The laser of claim 4, wherein the gas mixture further comprises argon as an active rare gas such that the laser comprises an ArF gas mixture, and wherein the gas mixture includes between, 77 ppm and 2000 ppm of a xenon attenuator,
wherein the energy of output pulses of the laser is less than the energy would be if the xenon were nor included in the gas mixture.

15. The laser of claim 14, wherein the xenon concentration is 30 ppm or more.

16. The laser of any one of claim 4 or 1, further comprising a gas control unit including a supply of xenon gas internal to the laser housing.

17. The ArF laser of claim 16, wherein said gas control unit includes a xenon generator including a supply of condensed matter xenon in a controlled environment for supplying the xenon gas.

18. The laser of claim 4, wherein the gas mixture further includes krypton as an active rare gas such that the laser comprises a KrF gas mixture:
wherein the concentration of the attenuating gas additive in the gas mixture is adjusted to control the energy stability of the laser bean.

19. The laser of claim 18, wherein the concentration of gas additive in the gas mixture is also adjusted to control the energy overshoot of the laser beam when the laser is operating in burst mode.

20. The laser of claim 4, wherein the gas mixture further includes krypton as an active rare gas such that the laser comprises a KrF gas mixture:
wherein the concentration of attenuating gas additive in the gas mixture is adjusted to control the energy overshoot of the laser beam when the laser is operating in burst mode.

21. The laser of any one of claims 19–20, wherein the energy overshoot is controlled to be less than 20% by adjusting the concentration of the gas additive.

22. The laser of any of claim 18 or 20, wherein the attenuating gas is selected from the group consisting of xenon, argon, $WF_x$, $PtF_x$, a chrormium-containing species, an aluminum-containing species, a silicon-containing species, HF, $HF_2$, ozone, mercury, hafnium, $CRO_x$, $FO_x$, $AlO_x$, $HF_x$, $CF_2$, $CF_4$, $CF_6$, $CF_8$, $CF_3$, $CrOF_2$, $CrOF$, $CrO_2F$, $CrO_2F_2$, $CrO_2$, $CrO$, $Cr$, $CrF_2$, $CrF$, $SiF_4 SiF$, $OF$, $O_2F$, $OF_2$, Al, AlO, $Al_2O$, $Al_{2l\ O2}$, AlF, $AlF_2$, N, $N_2$, $N_x$, C, $C_2$, $C_x$, H, $H_2$, $H_x$, O, and $O_x$, where x is an integer from 3–16.

23. The laser of any one of claims 19–20, wherein the energy overshoot is controlled to be less than 10% by adjusting the concentration of the gas additive.

24. The laser of any of claims 19–20, wherein the energy overshoot is controlled to be less than 5% by adjusting the concentration of the gas additive.

25. The laser of any of claims 18–20, wherein the concentration of the gas additive in the gas mixture is also adjusted to control one of the pulse energy and the energy dose of the laser beam.

26. The laser of claim 4, further comprising an active rare gas of kypton such that the laser comprises a KTF gas mixture,
wherein said output laser beam has a specified energy, and wherein the discharge circuit is configured to apply an operating driving voltage to the electrodes only in a range at or above a minimum driving voltage which when applied to the electrodes would produce a laser beam above said specified energy without the attenuating gas additive in the gas mixture.

27. The laser of claim 4, further comprising an active rare gas of krypton such that the laser comprises a KTF gas mixture wherein the gas mixture includes between 17 ppm and 2000 ppm of xenon for attenuating the pulse energy of the laser.

28. The laser of claim 27, wherein the xenon concentration is 30 ppm or more.

29. The laser of claim 4, further comprising an active rare gas of krypton such that the laser comprises a KrF gas mixture, further comprising
a gas control unit including a supply of xenon gas internal to the laser housing.

30. The KrF laser of claim 29, wherein said gas control unit includes a xenon generator including a supply of condensed matter xenon in a controlled environment for supplying the xenon gas.

31. The laser of claim 4, wherein said specified energy is less than the laser would output without the attenuating noble gas additive in the gas mixture.

32. The laser of claim 31, wherein the discharge circuit is configured to apply an operating driving voltage to the electrodes only in a range at or above a minimum driving voltage which when applied to the electrodes would produce a laser beam above said specified energy without the xenon in the gas mixture.

33. The laser of claim 32, wherein the attenuating gas is selected from the group consisting of xenon, argon, krypton, $WF_x$, $PtF_x$, a chromium-containing species, an aluminum-containing species, a silicon-containing species, HF, $HF_2$, ozone, mercury, hafnium, $CRO_x$, $FO_x$, $AlO_x$, $HF_x$, $CF_2$, $CF_4$, $CF_6$, $CF_8$, $CF_3$, $CrOF_2$, $CrOF$, $CrO_2F$, $CrO_2F_2$, $CrO_2$, $CrO$, Cr, $CrF_2$, CrF, $SiF_4$, SiF, OF, $O_2F$, $OF_2$, Al, AlO, $Al_2O$, $Al_2O_2$, AlF, $AlF_2$, N, $N_2$, $N_x$, C, $C_2$, $C_x$, H, $H_2$, $H_x$, O, and $O_x$, where x is an integer from 3–16.

34. The laser of claim 4, wherein the discharge circuit is configured to apply an operating driving voltage to the electrodes only in a range at or above a minimum driving voltage which when applied to the electrodes would produce a laser beam above said specified energy without the attenuating gas additive.

35. The laser of any one of claim 2, 5, 7, 12, 14, 16, 18, 20, 26, 27, 29 or 4, wherein the laser is configured for operation at a repetition rate of 1 kHz or higher.

36. The laser of claim 35, wherein the laser is configured for operation at a repetition rate of 4 kHz or higher.

37. The system of claim 36, wherein the laser is configured for operation at a repetition rate of 4 kHz or higher.

38. A molecular fluorine laser, comprising:
a discharge chamber initially filled with a gas mixture including fluorine, a buffer gas and a trace amount of a noble gas additive selected from the group consisting of argon, xenon and krypton;

a plurality of electrodes in the discharge chamber connected to a discharge circuit for energizing the gas mixture;

a resonator surrounding the discharge chamber for generating an output laser beam around 157 nm.

39. The molecular fluorine laser of claim 38, wherein the gas additive attenuates the energy of the laser beam.

40. The molecular fluorine laser of claim 38, wherein said output laser beam has a specified energy, and wherein the discharge circuit is configured to apply an operating driving voltage to the electrodes only in a range at or above a minimum driving voltage which when applied to the electrodes would produce a laser beam above said specified energy without the trace amount of the gas additive in the gas mixture.

41. The molecular fluorine laser of claim 38, further comprising:

a detector for monitoring a parameter indicative of the concentration of gas additive in the gas mixture; and a gas control unit for replenishing the gas additive based on the value of the monitored parameter.

42. The molecular fluorine laser of claim 41, wherein said gas control unit includes an internal supply of the gas additive.

43. The molecular fluorine laser of claim 41, wherein the gas additive is xenon and said gas control unit includes a xenon generator including a supply of condensed matter xenon in a controlled environment for supplying the xenon gas.

44. An excimer or molecular fluorine laser, comprising:

a discharge chamber initially filled with a gas mixture at least including molecular fluorine, a buffer gas and a trace amount of a gas additive, wherein the concentration of the gas additive in the gas mixture is actively adjusted during laser operation to control a parameter of the output beam;

a plurality of electrodes in the discharge chamber connected to a discharge circuit for energizing the gas mixture by applying predetermined driving voltages to the electrodes at a repetition rate of at least one kilohertz;

a resonator including a line-narrowing and wavelength tuning module and the discharge chamber for generating an output laser beam at a specified energy, a gas supply unit coupled with the discharge chamber and configured to permit a quantity, of a molecular fluorine/buffer gas mixture less than two mbar to inject into said discharge chamber at selected intervals;

an energy detector for monitoring energies of the output beam;

a wavelength meter for monitoring wavelengths of the output beam;

a processor for receiving values of the energies and wavelengths and including signals indicative of a concentration of the molecular fluorine in the gas mixture and the output beam parameter that is controlled by said active adjustment of the concentration of the gas additive, the processor controlling the line-narrowing and wavelength tuning module to tune the wavelength, the discharge circuit to control the energy of the output beam and the gas supply unit to control the concentration of the molecular fluorine in the gas mixture and the additive gas species concentration to control said parameter of the output beam, and wherein values of the predetermined driving voltages are selected by the processor based on the received values of the energies, and wherein the trace amount of the gas additive is selected to control said output beam parameter, such that the overall stability of output beam parameters including said parameter, energy and wavelength is enhanced, and wherein the selected values of the predetermined driving voltages are influenced by the presence of the gas additive for providing the output beam at the specified energy.

45. The laser of claim 44, further comprising an active rare gas of argon such that the laser comprises an ArF gas mixture.

46. The ArF laser of claim 45, wherein the concentration of the gas additive in the gas mixture is adjusted to control the pulse energy in a range between substantially 3.5 mJ and 15 mJ.

47. The ArF laser of claim 45, wherein the concentration of the gas additive in the gas mixture is adjusted to control the pulse energy in a range between substantially 4.0 mJ and 5.5 mJ.

48. The laser of claim 47, wherein the energy overshoot is controlled to be less than 20% by adjusting the concentration of the gas additive.

49. The laser of claim 47, wherein the energy overshoot is controlled to be less than 10% by adjusting the concentration of the gas additive.

50. The laser of claim 47, wherein the energy overshoot is controlled to be less than 5% by adjusting the concentration of the gas additive.

51. The laser of claim 45, wherein the gas additive is selected from the group consisting of xenon, krypton, $WF_x$, $PtF_x$, a chromium-containing species, an aluminum-containing species, a silicon-containing species, HF, $HF_2$, ozone, mercury, hafnium, $CRO_x$, $FO_x$, $AlO_x$, $HF_x$, $CF_2$, $CF_4$, $CF_6$, $CF_8$, $CF_3$, $CrOF_2$, $CrOF$, $CrO_2F$, $CrO_2F_2$, $CrO_2$, $CrO$, $Cr$, $CrF_2$, $CrF$, $SiF_4$, $SiF$, $OF$, $O_2F$, $OF_2$, $Al$, $AlO$, $Al_2O$, $Al_2O_2$, $AlF$, $AlF_2$, $N$, $N_2$, $N_x$, $C$, $C_2$, $C_x$, $H$, $H_2$, $H_x$, $O$, and $O_x$, where x is an integer from 3–16.

52. The laser of claim 44, further comprising an active rare gas of krypton such that the laser comprises a KrF gas mixture wherein the concentration of the gas additive in the gas mixture is actively adjusted during laser operation to control the pulse energy.

53. The KrF laser of claim 52, wherein the concentration of the gas additive in the gas mixture is adjusted to control the pulse energy in a range between substantially 3.5 mJ and 15 mJ.

54. The KrF laser of claim 52, wherein the concentration of the gas additive in the gas mixture is adjusted to control the pulse energy in a range between substantially 4.0 mJ and 5.5 mJ.

55. The laser of claim 54, wherein the energy overshoot is controlled to be less than 20% by adjusting the concentration of the gas additive.

56. The laser of claim 54, wherein the energy overshoot is controlled to be less than 10% by adjusting the concentration of the gas additive.

57. The laser of claim 54, wherein the energy overshoot is controlled to be less than 5% by adjusting the concentration of the gas additive.

58. The laser of claim 52, wherein the gas additive is selected from the group consisting of xenon, argon, $WF_x$, $PtF_x$, a chromium-containing species, an aluminum-containing species, a silicon-containing species, HF, $HF_2$, ozone, mercury, hafnium, $CRO_x$, $FO_x$, $AlO_x$, $HF_x$, $CF_2$, $CF_4$, $CF_6$, $CF_8$, $CF_3$, $CrOF_2$, $CrOF$, $CrO_2F$, $CrO_2F_2$, $CrO_2$, $CrO$, Cr, $CrF_2$, CrF, $SiF_4$, SiF, OF, $O_2F$, $OF_2$, Al, AlO, $Al_2O$, $Al_2O_2$, AlF, $AlF_2$, N, $N_2$, $N_x$, C, $C_2$, $C_x$, H, $H_2$, $H_x$, O, and $O_x$, where x is an integer from 3–16.

59. The laser of any one of claim 4, 1, or 44, further comprising:

a trace amount of a second gas additive.

60. The laser of claim 59, wherein said first gas additive is xenon.

61. The laser of claim 60, wherein said second gas additive is oxygen.

62. The laser of claim 59, wherein the concentration of said first gas additive is adjusted to control at least one of energy overshoot and energy stability, and the concentration of said second gas additive is adjusted for controlling output energy.

63. The laser of claim 59, wherein the concentrations of said first and second gas additives are adjusted to control at least one of energy overshoot, energy stability, and output energy.

64. The laser of any one of claim 4, 1, or 44, wherein the gas mixture includes less than 0.01% fluorine, wherein the fluorine concentration is less than that which would result in maximum laser output energy and the concentration of the trace amount of the gas additive is selected to compensate the reduced output energy.

65. The laser of claim 64, wherein the fluorine concentration is less than; 0.08%.

66. The laser of any of claim 64 or 65, wherein the gas additive is xenon.

67. A method of initializing and operating an excimer or molecular fluorine laser having a gas mixture at least including molecular fluorine, a buffer gas, and a trace amount of a gas additive species for generating an output laser beam in burst mode, comprising the steps of:

selecting a value of a parameter of the output laser beam;

filling a gas mixture into the laser including a selected amount of the energy attenuating gas for controlling the parameter to the selected value;

operating the laser at a repetition rate of at least one kilohertz;

monitoring the concentration of and periodically replenishing the molecular fluorine of the gas mixture during operation of the laser based on the monitored concentration;

monitoring an energy of the output beam and adjusting values of input driving voltages for maintaining the energy at a specified energy based on the monitoring of the energy;

monitoring a wavelength of the output beam and controlling a line-narrowing and wavelength tuning unit for controlling the wavelength based on the monitoring of the wavelength;

wherein values of the input driving voltages are selected by the processor based on monitored values of the energy, and wherein the trace amount of the gas additive is selected to control said output beam parameter, such that the overall stability of output beam parameters including said parameter, energy and wavelength is enhanced, and wherein the selected values of the predetermined driving voltages are influenced by the presence of the gas additive for providing the output beam at the specified energy.

68. The method of claim 6, further comprising the steps:

measuring the output energy of the laser system at a predetermined discharge voltage; and adding more of the gas species to the gas mixture to reduce the output energy of the laser system, at said predetermined discharge voltage.

69. The method of claim 68, wherein the predetermined discharge voltage is the minimum voltage available for the laser.

70. The method of claim 68, wherein the adding step reduces the output energy to a selected energy not available without performing said adding step.

71. The method of any of claim 68 or 70, wherein the previous steps are repeated at a later time and less of the attenuating gas species is added to reduce the output energy to a same energy as after the original steps.

72. The method of claim 71, wherein the filling and measuring steps are repeated at a still later time and no gas additive is added because the output energy is at the same energy as after the original steps.

73. The method of claim 71, wherein the attenuating species is xenon.

74. The method of any of claims 68–70, wherein the attenuating species is xenon.

75. The method of claim 6, further comprising the step selecting a value of energy stability; and wherein the filling step comprises filling the gas mixture into the laser including the selected amount of the attenuating gas for controlling the energy stability to the selected value.

76. The method of claim 75, further comprising the steps of:

measuring the energy stability of the laser beam; and adjusting the concentration of the attenuating gas to control the value of the energy stability.

77. The method of claim 6, further comprising the step selecting a value of energy overshoot; and wherein the filling step comprises filling the gas mixture into the laser including the selected amount of the energy attenuating gas for controlling the energy overshoot to the selected value.

78. The method of claim 77, further comprising the steps of:

measuring the energy overshoot of the laser beam; and adjusting the concentration of the energy attenuating gas to control the value of the energy overshoot.

79. The method of claim 67, further comprising the step selecting a value of pulse energy at a certain discharge voltage; and wherein the filling step comprises filling the gas mixture into the laser including the selected amount of the gas additive for attenuating the pulse energy to the selected value.

80. The method of claim 78, further comprising the steps of:

measuring the pulse energy of the laser beam; and adjusting the concentration of the gas additive to control the value of the pulse energy.

81. The method of claim 67, said laser including a discharge chamber for holding a laser gas mixture, said laser including an electrical discharge circuit for generating an excitation voltage in a range between a minimum and maximum voltage to create output laser pulses and wherein the energy of each output pulse falls within a predetermined range defined by a minimum and a maximum level, wherein the filling step comprises filling the discharge chamber with the gas mixture including the trace amount of the attenuating gas, with the proportions of the gases in the mixture being selected such that if the attenuating gas was not present in the mixture, the energy per pulse would exceed the maximum level even if the laser was excited with the minimum voltage, said attenuating gas permitting said laser to generate pulses having an energy within the predetermined range; and wherein the method further comprises the step of adjusting the constituents of the gas mixture over time as the laser gas mixture ages, said adjusting step including lowering the concentration of the attenuating gas in the gas mixture so that as the gas mixture ages, the energy per pulse can be maintained within the predetermined range.

82. The method of claim 81, wherein said attenuating gas is xenon.

83. The method of claim 81, further comprising the steps of:
monitoring the energy of the laser pulses; and
adjusting the voltage to maintain the energy per pulse within the predetermined range.

84. The method of any of claims 81–83, further comprising the step of adjusting the proportion of the attenuating gas to maintain the energy per pulse with the predetermined ranger.

85. The method of claim 67, further comprising the steps:
monitoring the energy of the laser output pulses;
adjusting the voltage to maintain the energy per pulse within the predetermined range; and
adjusting the proportion of the attenuating gas during laser operation to maintain the energy per pulse with the predetermined range.

86. The method of claim 67, said laser including a discharge chamber for holding a laser gas mixture, said laser including an electrical discharge circuit for generating an excitation voltage in a range between a minimum and maximum voltage to create output laser pulses and wherein the energy dose falls within a predetermined range defined by a minimum and a maximum level, wherein the filling step comprises filling the discharge chamber with the gas mixture including the trace amount of the attenuating gas, with the proportions of ale gases in the mixture being selected such that if the attenuating gas was not present in the mixture, the energy dose would-exceed the maximum level even if the laser was excited with the minimum voltage, said attenuating gas permitting said laser to generate pulses such that the energy dose is maintained within the predetermined range; and wherein the method further comprises the step adjusting the constituents of the gas mixture over time as the laser gas mixture ages, said adjusting step including lowering the concentration of the attenuating gas in the gas mixture so that as the gas mixture ages, the energy dose can be maintained within the predetermined range.

87. The method of claim 86, wherein said attenuating gas is xenon.

88. The method of claim 86, further comprising the steps of:
monitoring the energy dose; and
adjusting the voltage to maintain the energy dose within the predetermined range.

89. The method of any of claims 86–88, further comprising the step of adjusting the proportion of the attenuating gas to maintain the energy dose within the predetermined range.

90. The method of claim 67, further comprising the steps:
monitoring the energy dose;
adjusting the voltage to maintain the energy dose within the predetermined range; and
adjusting the proportion of the attenuating gas during laser operation to maintain the energy dose with the predetermined range.

91. The method of claim 67, said laser including a discharge chamber for holding a laser gas mixture, said laser including an electrical discharge circuit for generating an excitation voltage in a range between a minimum and maximum voltage to create output laser pulses and wherein the energy stability falls within a predetermined range defined by a minimum and a maximum level, wherein the filling step comprises filling the discharge chamber with the gas mixture including the trace amount of the attenuating gas, with the proportions of the gases in the mixture being selected such that if the attenuating gas was not present in the mixture, the energy stabilty would be below the maximum level, said attenuating gas permitting said laser to generate pulses such that the energy stability is maintained within the predetermined range.

92. The method of any of claim 43, 74, 76, 78, 80, 84, 85, 89, 90 or 91, wherein the attenuating gas is selected from the group consisting of xenon, argon, krypton, $WF_x$, $PtF_x$, a chromium-containing species, an aluminum-containing species, a silicon-containing species, HF, $HF_2$, ozone, mercury, hafnium, $CRO_x$, $FO_x$, $AlO_x$, $HF_x$, $CF_2$, $CF_4$, $CF_6$, $CF_8$, $CF_3$, $CrOF_2$, $CrOF$, $CrO_2F$, $CrO_2F_2$, $CrO_2$, $CrO$, $Cr$, $CrF_2$, $CrF$, $SiF_4$, $SiF$, $OF$, $O_2F$, $OF_2$, $Al$, $AlO$, $Al_2O$, $Al_2O_2$, $AlF$, $AlF_2$, $N$, $N_2$, $N_x$, $C$, $C_2$, $C_x$, $H$, $H_2$, $H_x$, $O$, and $O_x$, where x is an integer from 3–16.

93. The method of claim 67, said laser including a discharge chamber for holding a laser gas mixture, said laser including an electrical discharge circuit for generating an excitation voltage in a range between a minimum and maximum voltage to create output laser pulses and wherein the energy overshoot falls within a predetermined range defined by a minimum and a maximum level, wherein the filling step comprises filing the discharge chamber with the gas mixture including the trace amount of the attenuating gas, with the proportions of the gases in the mixture being selected such that if the attenuating gas was not present in the mixture, the energy overshoot would exceed the maximum level, said attenuating gas permitting said laser to generate pulses such that the energy overshoot is maintained within the predetermined range.

* * * * *